(12) United States Patent
Hirano et al.

(10) Patent No.: US 7,247,178 B2
(45) Date of Patent: Jul. 24, 2007

(54) CAPACITOR AND METHOD FOR PRODUCING THE SAME, AND CIRCUIT BOARD WITH A BUILT-IN CAPACITOR AND METHOD FOR PRODUCING THE SAME

(75) Inventors: Koichi Hirano, Hirakata (JP); Tsunenori Yoshida, Yawata (JP); Hiroyuki Handa, Hirakata (JP); Yoshihisa Yamashita, Kyoto (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/523,574

(22) Filed: Sep. 20, 2006

(65) Prior Publication Data

US 2007/0022590 A1     Feb. 1, 2007

Related U.S. Application Data

(62) Division of application No. 10/726,675, filed on Dec. 4, 2003, now Pat. No. 7,126,811.

(30) Foreign Application Priority Data

Dec. 27, 2002   (JP)   ............................ P2002-379231

(51) Int. Cl.
*H01G 9/00*   (2006.01)
(52) U.S. Cl. .................. 29/25.03; 361/321.6; 361/530; 361/511; 361/517; 361/520; 29/25.03; 257/E21.008
(58) Field of Classification Search ..................... None
See application file for complete search history.

(56) References Cited

U.S. PATENT DOCUMENTS

| | | | |
|---|---|---|---|
| 5,122,931 A * | 6/1992 | Shimada et al. ............ 361/523 |
| 6,038,133 A | 3/2000 | Nakatani et al. | |
| 6,246,569 B1 | 6/2001 | Strange et al. | |
| 6,310,765 B1 | 10/2001 | Tanahashi et al. | |
| 6,413,282 B1* | 7/2002 | Tanahashi et al. ......... 29/25.03 |

(Continued)

FOREIGN PATENT DOCUMENTS

JP          11-220262        8/1999

(Continued)

*Primary Examiner*—Michael Lebentritt
*Assistant Examiner*—Kyoung Lee
(74) *Attorney, Agent, or Firm*—Wenderoth, Lind & Ponack, L.L.P.

(57) ABSTRACT

A miniature solid electrolytic capacitor is provided, which is suitable for being disposed within an electrically insulating layer, and is connected to other component using an electrically conductive adhesive with a connection resistance at an anode low and with connection reliability improved. Specifically, the electrolytic capacitor includes a valve metal element for an anode 10 having a capacitor forming part 10A and an electrode lead part 10B, a dielectric oxide film 11 formed on the valve element, a solid electrolyte layer 12 formed on the dielectric oxide film 11 and a charge collecting element for a cathode 13 formed on the solid electrolyte layer 12, wherein at least one through hole 15 is formed in the electrode lead part 10B so as to expose a core 10C of the valve metal element, and an exposed portion 10D of the core is used for connecting portion.

21 Claims, 11 Drawing Sheets

U.S. PATENT DOCUMENTS

| | | |
|---|---|---|
| 6,433,417 B1 | 8/2002 | Aoyama |
| 6,473,293 B2 | 10/2002 | Shimada et al. |
| 6,504,705 B2 | 1/2003 | Shimada et al. |
| 6,680,841 B2 | 1/2004 | Tadanobu et al. |

| | | |
|---|---|---|
| 2003/0039093 A1 | 2/2003 | Tadanobu et al. |

FOREIGN PATENT DOCUMENTS

| | | |
|---|---|---|
| JP | 2002-198264 | 7/2002 |

* cited by examiner (a)

(b)

(a)

(b)

(c)

(d)

CAPACITOR AND METHOD FOR PRODUCING THE SAME, AND CIRCUIT BOARD WITH A BUILT-IN CAPACITOR AND METHOD FOR PRODUCING THE SAME

CROSS-REFERENCE TO RELATED APPLICATIONS

This application is a divisional of U.S. application Ser. No. 10/726,675, filed Dec. 4, 2003, now U.S. Pat. No. 7,126,811.

The present application claims a priority under 35 U.S.C. §119 to Japanese Patent Application No. 2002-379231 filed on Dec. 27, 2002, entitled "Capacitor and method for producing the same, and circuit board with a built-in capacitor and method for producing the same." The contents of that application are incorporated herein by the reference thereto in their entirety.

FIELD OF THE INVENTION

The present invention relates to an electrolytic capacitor which can be built in a substrate, a circuit board with the capacitor built-in, and a functional module with the capacitor built-in.

BACKGROUND OF THE INVENTION

Recently, as an electric and electronic device become more miniature and more high-density, there are employed many techniques wherein a circuit board having a plurality of components is modularized as a package for each functional block, and the necessary modules are combined so as to obtain a predetermined electrical circuit, as a substitute for a prior technique wherein individual components are mounted on a board so as to form an electrical circuit. This module is generally formed by mounting necessary components on one or both surfaces of a daughter board. However, when a technique which includes mounting components on a surface of a board is employed, a surface area of the module cannot be smaller than those of the mounted components (that is, the total foot prints of the components). For this reason, there is a limitation to high-density assembly, even when this technique is employed. Further, since the components are disposed on a flat surface according to the technique, a connection distance between the components is inevitably longer depending on its constitution, which results in a problem of increase in loss and increase in inductance at a high frequency.

In order to eliminate or alleviate such a problem, a module is proposed wherein components are arranged not only two-dimensionally by being mounted on a surface of a board, but also three-dimensionally by being disposed inside the board. See Japanese Patent Kokai (Laid-Open) Publication No. 11(1999)-220262(A). This publication discloses a module with a built-in circuit component which includes an electrically insulating substrate formed of a mixture comprising 70 wt % to 95 wt % of an inorganic filler and a thermosetting resin, a plurality of wiring patterns formed on at least a principal plane of the electrically insulating substrate, at least one active and/or passive component arranged in an internal portion of the electrically insulating substrate and electrically connected to the wiring patterns, and an inner via formed in the electrically insulating substrate for electrically connecting the wiring patterns. By constituting such a module, high-density can be achieved by three-dimensional connection, and the loss and inductance can be reduced by a shortened wiring length.

A capacitor is included in main components for constituting the functional module. Recently, as an electronic equipment is increasingly digitalized and operates at a higher speed, it is strongly required that the capacitor used therefor has a large capacitance and a low impedance.

Conventionally, as the capacitors, an electrolytic capacitor in which a valve metal such as aluminum or tantalum is used, and a multilayer ceramic capacitor in which Ag/Pd or Ni is used for electrodes and barium titanate is used as a dielectric, have been employed. In addition to these capacitors, a solid electrolytic capacitor in which a cathode is made of an electrically conductive polymer has been used. The solid electrolytic capacitor is preferably used, since it has a large capacitance per unit volume and it is of a thin thickness whereby the height of the module can be reduced.

A configuration of the solid electrolytic capacitor is described below. The solid electrolytic capacitor contains a capacitor element which includes a valve metal element for an anode (herein referred to anode valve metal element), a dielectric oxide film formed on a surface of the anode valve metal element, a solid electrolyte layer formed on the dielectric oxide film, and a charge collecting element for a cathode formed on the dielectric oxide film. The anode valve metal element is, for example, an aluminum foil for an anode. This foil for an anode is usually subjected to a surface roughening treatment and the dielectric oxide film is formed on the treated surface. An electrically conductive polymer layer made of polypyrrole, polythiophene, or polyaniline is formed as the solid electrolyte layer. Further, a carbon layer and an Ag paste layer are formed in the stated order, so that the charge collecting element for a cathode is formed. An anode terminal and a cathode terminal of lead frames are generally connected to this capacitor element. Further, the capacitor element is sealed with a molded resin, which results in the capacitor as the component. See Japanese Patent Kokai (Laid-Open) Publication No. 2002-198264(A).

For such a solid electrolytic capacitor, various attempts have been made to reduce an equivalent series resistance (hereinafter referred to as ESR) of the capacitor, and a low equivalent series inductance (hereinafter referred to as ESL) which is due to an external connection terminal of the capacitor. In order to reduce the ESR, a material for the electrically conductive polymer and materials for the carbon layer and the Ag paste layer have been developed. On the other hand, the anode connection is made by, for example, welding the anode to the lead flame. Therefore, the connection resistance of the anode connection is lower than that of the cathode connection. For this reason, improving the anode connection is not employed so often as a technique for reducing the ESR.

In case where the capacitor is embedded in the substrate, as the capacitor is smaller in size, an advantage in terms of configuration such as miniaturization and higher-density of the module and an electrical advantage such as a shortened wiring length and a low impedance are obtained more effectively. However, the capacitor of the above-described configuration tends to be larger in size, since the molding resin and lead frames are disposed around the capacitor element. For this reason, such a capacitor package does not offer these advantages sufficiently. Therefore, an attempt to connect the capacitor element three-dimensionally to the board has been made by embedding the capacitor element directly in the board without using the molding resin and the lead frames.

When the capacitor is mounted on a wiring layer of a predetermined wiring pattern with solder, solder mounting which is conventionally employed for mounting a chip component cannot be employed since the valve metal element for an anode is not wetted by the solder. Further, use of lead (Pb) is restricting from the viewpoint of environmental protection, and therefore, Sn—Pb eutectic solder which has been conventionally used is toward prohibition. As an alternative to this, a solder material which does not contain Pb is developing. The melting point of the Pb-free material is generally higher than that of the eutectic solder. As the melting point of the solder material is higher, the capacitor element is more seriously damaged by heat that is applied upon welding, which results in deterioration of the capacitor properties. In order to avoid such disadvantage, a method for connecting the capacitor to the wiring pattern with a Pb-free electrically conductive adhesive is also employed.

However, when the anode of the capacitor and the wiring pattern are connected with the electrically conductive adhesive (herein referred to as a conductive adhesive), there is a problem of increase in connection resistance at the anode due to the dielectric oxide film on the surface of the anode valve metal element, which makes it difficult to realize the low ESR. Further, since the surface of the valve metal element is roughened, the conductive adhesive is absorbed into pores (that is, depressed portions) of the anode formed by the surface roughening treatment. This also presents a problem of increase in connection resistance. Further, this presents a problem of deterioration of the connection reliability because of a low bonding strength between the anode and the conductive adhesive.

SUMMARY OF THE INVENTION

In order to solve these problems, the present invention provides an electrolytic capacitor in the form of element with a low ESR and a low height which can be connected to a wiring layer with a low resistance and is suitable for being embedded in a circuit board, and a method for producing the same. Further, the present invention provides a module with a built-in capacitor of a small size, a low height and a high density which has a low ESL and high-frequency responsibility and can be driven by a large current, and a method for producing the same. Furthermore, the present invention provides a module with a built-in capacitor which has an electrical function as a single package.

The present invention provides a capacitor comprising:
a valve metal element for an anode including a capacitor forming part and an electrode lead part;
a dielectric oxide film provided on a surface of the valve metal element for an anode;
a solid electrolyte layer provided on the dielectric oxide film; and
a charge collecting element for a cathode provided on the solid electrolyte layer, wherein at least one through hole is formed in the electrode lead part of the valve metal element for an anode to expose core of the valve metal element outside.

The capacitor of the present invention is characterized in that at least one through hole is formed in the electrode lead part of the valve metal element for an anode so that the core of the valve metal element is exposed outside. Here, the "core" of the valve metal element means a metal part of the valve metal element. In the electrolytic capacitor of the present invention, the core of the valve metal element is exposed outside on at least a part of the inner surface of the through hole. A portion where the core is exposed outside corresponds to a metal surface which is not oxidized or a surface of a thin oxide film which is formed by natural oxidation. Therefore, the interface resistance of a connection area between the portion where the core is exposed outside and an electric conductor (such as a conductive adhesive) is much smaller than that of a connection area between the dielectric oxide film and the electric conductor. For this reason, in the present invention, the portion where the core is exposed outside (hereinafter, referred to as a "core-exposed portion") serves as a connection portion (or a connection terminal) of the anode. Therefore, the present invention can provide an electrolytic capacitor with high connection reliability, in which a low connection resistance at the anode and a low ESR are low.

In the capacitor of the present invention, the through hole is filled with an electrically conductive resin composition (herein referred to as conductive resin composition) containing metal powder and a thermosetting resin, which composition is connected to the core of the valve metal element. The connection between the conductive resin composition and the core of the valve metal element is made by cure of the thermosetting resin. In the capacitor of this constitution, the core-exposed portion is covered with and electrically connected to the conductive resin composition. Therefore, in this capacitor, the core-exposed portion of the valve metal element serves as the connection portion through the conductive resin composition. Further, the conductive resin composition makes it possible to easily and reliably provide an electrical connection between the core of the valve metal element and other member (for example, a wiring layer of a circuit board). This is because the connection does not require the conductive adhesive to be inserted into the through hole to contact with the inner surface of the hole. Therefore, the capacitor of this constitution has a lower ESR and more improved reliability.

In the capacitor wherein the through hole is filled with the conductive resin composition, the diameter of the through hole is preferably from 0.5 to 2 times the thickness of the valve metal element for an anode. When the diameter is in this range, the conductive resin composition is easily injected and well retained in the through hole. When the diameter of the through hole is too large, the resin composition within the hole may fall off the hole.

Alternatively, the electrolytic capacitor of the present invention preferably includes a single electrically conductive particle (herein referred to as conductive particle) or a single electrically conductive fiber (herein referred to as conductive fiber) which contacts with at least a part of the core portion of the valve metal element in the through hole. The conductive particle and the core-exposed portion are electrically connected at the contact area therebetween. Therefore, in this capacitor of this constitution, the core-exposed portion of the valve metal element serves as the connection portion through the conductive particle or the conductive fiber which exists in the through hole. The capacitor of this constitution is also easily connected to other member with the conductive adhesive since the conductive particle or the conductive fiber exists within the through hole. Therefore, this capacitor also has a lower ESR and more improved reliability.

It is preferable that the end portion(s) of the conductive particle or the conductive fiber disposed within the through hole extends slightly beyond a surface(s) of the electrode lead part which surface is to be connected to other member (such as a wiring board), which facilitates connecting the capacitor to, for example, a wiring layer.

In the capacitor wherein the conductive particle or fiber is disposed within the through hole, it is preferable that the particle or fiber pierces the electrode lead part, that is, the through hole is formed by piercing the electrode lead part with the particle or fiber. This constitution ensures more reliable electrical connection between the conductive particle or fiber and the core of the anode valve metal element, whereby more improved reliability is achieved.

In the capacitor of the present invention having the through hole, it is preferable that at least one electrically conductive particle contacts with the core of the valve metal element for an anode in the electrode lead part. Here, "an electrically conductive particle contacts with the core of the valve metal element for an anode" means that a part of the electrically conductive particle(s) pierces the dielectric oxide film formed on the surface of the valve metal element for an anode and reaches the core. The core which contacts with the conductive particle(s) can be electrically connected to other member (such as a wiring board) through the particle. That is, this conductive particle(s) as well as the core-exposed portion can serve as the connection portion of the anode. Therefore, this constitution increases the area of the connection portion of the anode resulting in a lower connection resistance, and therefore an electrolytic capacitor of a lower loss can be obtained.

In the above electrolytic capacitor wherein the conductive particle(s) contacts with the core of the anode valve metal element, it is preferable that at least a part of the particle(s) is coated with a thermosetting resin. That is, it is preferable that the conductive particle(s) is fixed to the anode valve metal element with the thermosetting resin. This constitution improves a connection strength between the conductive particle(s) and the anode valve metal element, and therefore gives an electrolytic capacitor which has a higher connection stability and a higher reliability.

Alternatively, in the capacitor of the present invention having the through hole, it is preferable that an electrically conductive resin composition containing metal powder and a thermosetting resin is applied to a surface of the electrode lead part of the valve metal element for an anode. This constitution increases the area which contributes to the connection of the anode to the other member (such as a wiring board), resulting in a lower connection resistance and a higher connection reliability.

Further, the present invention provides a circuit board with a built-in capacitor wherein the electrolytic capacitor of the present invention is disposed within an electrically insulating layer, and connected to a wiring layer with a conductive adhesive. "An electrolytic capacitor is disposed within an electrically insulating layer" means that a part or the whole of the electrolytic capacitor is buried or embedded in the electrically insulating layer. This circuit board with a built-in capacitor includes a small-sized electrolytic capacitor which does not have a molding resin and lead frames. Further, anode of the electrolytic capacitor is connected to the wiring layer at the core-exposed portion of the valve metal element, and the cathode is connected to the wiring layer on a surface of the charge collecting element for a cathode, through the conductive adhesive respectively. As described above, the electrolytic capacitor enables the anode to be connected to the wiring layer with a low connection resistance. Therefore, the circuit board with a built-in capacitor of the present invention is characterized in that 1) its height is low, 2) miniaturization and higher-density of the board can be realized, and 3) it has a low ESR and a low ESL which enables high-frequency response and large-current driving of the board.

In the circuit board with a built-in capacitor of the present invention, wiring layers are placed on both surfaces (that is both sides) of the electrically insulating layer and electrically connected through an inner via(s) which is formed in the electrically insulating layer. This constitution makes it possible to connect two wiring layers through an inner via(s) at a desired position(s) and to shorten short the wiring length. Therefore, this constitution contributes to miniaturization, higher-density and a lower height of the circuit board with a built-in capacitor, and reduces the loss and inductance of the circuit board.

In this specification, a "surface" with respect to a layer or a sheet member is referred to a surface vertical to the thickness direction, unless otherwise specified.

In the circuit board with a built-in capacitor of the present invention, the electrically insulating layer within which the capacitor is disposed preferably contains an inorganic filler and a thermosetting resin. By selecting the inorganic filler optimally, the coefficient of liner expansion, the thermal conductivity and the dielectric constant of the electrically insulating layer can be controlled, which results in a circuit board with a built-in capacitor which has a high reliability and is excellent in heat releasability and high-speed responsibility. By selecting the thermosetting resin optimally, the coefficient of liner expansion, the glass transition point, and the elastic modulus of the electrically insulating layer can be controlled, which results in a circuit board with a built-in capacitor which has a high reliability.

The inner via(s) is preferably formed of a mixture containing electrically conductive powder (herein referred to as conductive powder) and a thermosetting resin. The conductive powder is one which is made of an electrically conductive material (specifically, a metal). The thermosetting resin in a cured state constitutes the inner via. Such an inner via has high reliability, and therefore improves the connection reliability of the circuit board as a whole.

When the circuit board of the present invention contains a built-in capacitor in which a through hole is filled with a conductive resin composition in the electrode lead part of the anode valve metal element, metal powder contained in the resin composition is preferably made of the same material as that of the conductive filler contained in the conductive adhesive. This reduces a resistance of the connection portion between the electrode lead part of the capacitor anode and the wiring layer, and improves reliability. Similarly, when a conductive resin composition is applied to the electrode lead part of the anode valve metal element in the electrolytic capacitor, metal powder. contained in the resin composition is preferably made of the same material as that of the conductive filler contained in the conductive adhesive. Similarly, when a conductive particle or fiber is disposed in the through hole of the electrolytic capacitor, the particle or fiber is preferably made of the same material as that of the conductive filler contained in the conductive adhesive. Similarly, when at least one conductive particle contacts with the core of the anode valve metal element in the electrode lead part, the conductive particle is preferably made of the same material as that of the conductive filler contained in the conductive adhesive. In other words, a conductive component which exists in the electrode lead part of the electrolytic capacitor, and the conductive filler contained in the conductive adhesive are preferably unified in terms of material.

When the circuit board with a built-in capacitor is of a constitution having the inner via, the inner via is preferably disposed so that it aligns with the through hole formed in the electrolytic capacitor. That is, the inner via and the through hole are preferably placed on one line. This constitution shortens the connection length between the electrolytic capacitor and the wiring layer, resulting in a lower ESR and a lower ESL of the circuit board.

In the constitution wherein the inner via aligns with the through hole of the electrolytic capacitor, in the case where the through hole of the anode valve metal element is filled with a conductive resin composition, the conductive powder contained in the inner via is preferably made of the same material as that of metal powder contained in the conductive resin composition. This reduces the connection resistance between the electrode lead part of the anode in the electrolytic capacitor and the inner via, resulting in improvement of connection reliability. Similarly, when a conductive resin composition is applied to the electrode lead part of the anode valve metal element in the electrolytic capacitor, metal powder contained in the resin composition is preferably made of the same material as that of the conductive powder contained in the inner via. Similarly, when a conductive particle or fiber is disposed within the through hole of the capacitor, the particle or fiber is preferably made of the same material as that of the conductive powder contained in the inner via. Similarly, in the case where at least one conductive particle contacts with the core of the anode valve metal element in the electrode lead part, the conductive particle is preferably made of the same material as that of the conductive powder contained in the inner via. In other words, a conductive component which exists in the electrode lead part of the electrolytic capacitor, and the conductive powder contained in the inner via are preferably unified in terms of material.

In the circuit board with a built-in capacitor of the present invention, a semiconductor chip may be further included and electrically connected to the electrolytic capacitor disposed in the electrically insulating layer, and the wiring layer may be connected to an external electrode through the inner via formed in the electrically insulating layer. This circuit board with a built-in capacitor fulfills a predetermined function together with the semiconductor chip and other optional components, as a module. Herein, a "module" means a component which can be added, deleted and substituted as one unit. The module is, for example, a memory module or a plug-in module. The semiconductor chip is, for example, a switching element or a microprocessor.

Alternatively, in the circuit board with a built-in capacitor of the present invention, at least one component selected from the group of a semiconductor chip such as a switching element or a microprocessor, another capacitor and inductor may be disposed within the electrically insulating layer within which the electrolytic capacitor is disposed or another electrically insulating layer, and the component may be electrically connected to a wiring layer. Such a circuit board with a built-in capacitor fulfills a predetermined function as one module.

This configuration gives a circuit board with a built-in capacitor that serves as a miniature and thin functional module of high density which fulfills a function of an electrical circuit as a single package. Further, this configuration wherein an element for forming an electrical circuit is disposed within the board, gives a more miniature and thinner circuit module. Furthermore, this configuration makes it possible to shorten the wiring length of the entire circuit, resulting in a circuit module which has a low loss and a low stray capacitance and a low inductance. In addition, the module presents improved noise immunity, since an passive component can be disposed near the semiconductor chip. Therefore, the present invention makes it possible to obtain a circuit board with a built-in capacitor serving as a good functional module, in which 1) miniaturization, 2) higher-density, 3) low-height, and 4) excellent high-speed responsibility are realized.

In the case where the semiconductor chip is a switching element, and an inductor is electrically connected to the semiconductor chip and the capacitor, a circuit board with a built-in capacitor containing such components serves as a switching power supply module. That is, the circuit board of this constitution may be identified as a switching power supply module including a switching element, a capacitor, and an inductor which are electrically connected, wherein:
the capacitor is of the present invention, and disposed within an electrically insulating layer and connected to a wiring layer with an electrically conductive adhesive;
the wiring layer is connected to an external electrode through an inner via(s) formed in the electrically insulating layer. The switching power supply module is preferably, for example, a DC/DC converter. By using the electrolytic capacitor of a large capacitance and a low height in the switching power supply module, power density is increased, while ripple voltage is reduced. Further, by disposing the electrolytic capacitor of the present invention within the electrically insulating layer, the power density can be further increased.

In the case where the semiconductor chip is a microprocessor, a circuit board with a built-in capacitor containing this chip serves as a microprocessor module. That is, the circuit board of this constitution may be identified as a microprocessor module, wherein:
at least one microprocessor is electrically connected to a capacitor:
the capacitor is of the present invention, and disposed within an electrically insulating layer and connected to a wiring layer with an electrically conductive adhesive;
the wiring layer is connected to an external electrode through an inner via(s) formed in the electrically insulating layer. Alternatively, the circuit board with a built-in capacitor which is provided with a microprocessor may be identified as a microprocessor module comprising the circuit board with a built-in capacitor of the present invention and at least one microprocessor, wherein the microprocessor is electrically connected to a wiring layer of the circuit board.

In this microprocessor module, the microprocessor is generally mounted on a surface of the circuit board with a built-in capacitor of the present invention. The microprocessor is preferably arranged so that the electrolytic capacitor of the present invention is placed just below the microprocessor. This arrangement makes it possible to reduce the area occupied by the module. Further, this arrangement makes it possible to shorten the distance between the microprocessor and the capacitor, resulting in a microprocessor module excellent in high-speed responsibility.

In the above, the terms "metal powder" or "(electrically) conductive particle" refers to the conductive component contained in the electrically conductive resin composition, the term "(electrically) conductive filler" refers to the conductive component contained in the electrically conductive adhesive, and the term "(electrically) conductive powder" refers to the conductive component contained in the inner via. These are not necessarily different from each other, and these have a commonality in that they serve to ensure the electroconductivity of the composition or the mixture in which they are to be contained. Further, each of these is made of an electrically conductive material. Therefore, it should be noted that a specific shape and material of one of these components may be the same as those of one or more other components.

The present invention also provides a method for producing the electrolytic capacitor of the present invention. Specifically, the capacitor of the present invention is produced by a method including: producing an electrolytic capacitor unit by a method including:

(a) forming a dielectric oxide film by oxidizing a surface of a valve metal element for an anode which includes a capacitor forming part and an electrode lead part; and (b) forming a solid electrolyte layer on the dielectric oxide film, followed by forming a charge collecting element for a cathode on the solid electrolyte layer; and (c) forming a through hole(s) in the electrode lead part of the valve metal element for an anode of the obtained electrolytic capacitor unit to expose the core of the valve metal element. In this specification, the term "electrolytic capacitor unit" refers to a solid electrolytic capacitor before the through hole(s) is formed, and this term is used to distinguish such a capacitor from the capacitor according to the present invention. The electrolytic capacitor unit may be referred to as an "electrolytic capacitor" in terms of its function as a capacitor.

Alternatively, the electrolytic capacitor of the present invention may be produced by a method including:

(a) forming a dielectric oxide film by oxidizing a surface of a valve metal element for an anode which includes a capacitor forming part and an electrode lead part;

(c) forming a through hole(s) in the electrode lead part of the valve metal element for an anode to expose the core of the valve metal element; and (b) forming a solid electrolyte layer on the dielectric oxide film, followed by forming a charge collecting element for a cathode on the solid electrolyte layer, in this order (that is, the operations (a), (c) and (b) are performed in the stated order).

Both of the above methods are characterized in that through hole(s) is formed in the electrode lead part of the valve metal element for an anode of the electrolytic capacitor so as to expose the core of the valve metal element. The two methods are different in when the trough hole(s) is formed. In the first method, the through hole(s) is formed after the solid electrolyte layer and the charge collecting element for a cathode have been formed. In the second method, the through hole(s) is formed before the solid electrolyte layer and the charge collecting element for a cathode are formed. The advantage of the first method is that the core is not oxidized even if a heat treatment is conducted for polymerizing the electrolyte layer. The advantage of the second method is that a work piece is handled easily when forming the through hole(s).

A method for producing a solid electrolytic capacitor generally includes the operations (a) and (b). Hereinafter, in order to clarify the features of each production method of the present invention and to avoid a lengthy description, "forming a dielectric oxide film by oxidizing a surface of a valve metal element for an anode which includes a capacitor forming part and an electrode lead part" merely refers to as "the operation (a)", and "forming a solid electrolyte layer on the dielectric oxide film, followed by forming a charge collecting element for a cathode on the solid electrolyte layer" merely refers to as "the operation (b)."

The methods of the present invention further includes:

preparing an electrically conductive resin composition containing metal powder and an uncured thermosetting resin;

filling with the electrically conductive resin the through hole(s) formed in the electrode lead part of the valve metal element for an anode; and connecting the electrically conductive resin composition to the core of the valve metal element by a heat treatment. This method gives an electrolytic capacitor wherein the conductive resin composition is filled into the through hole(s) and connected to the core of the valve metal element for an anode.

It is preferable that this method further includes pressurizing the electrode lead part of the valve metal element for an anode after filling the through hole(s) with the conductive resin composition. By adding a pressurization step, the connection between the core of the valve metal element for an anode and the conductive resin composition becomes stronger. The electrolytic capacitor produced in this manner gives a lower connection resistance between the electrode lead part and other member (specifically, a wiring board), and more improved connection reliability.

The present invention provides a method for producing an electrolytic capacitor including:

producing an electrolytic capacitor unit by a method including the operations (a) and (b); and disposing at least one electrically conductive particle within the electrode lead part of the valve metal element for an anode of the electrolytic capacitor unit, by placing the particle on the electrode lead part and then pressurizing, the particle diameter being larger than the thickness of the valve metal element for an anode.

The present invention also provides a method for producing an electrolytic capacitor including:

producing an electrolytic capacitor unit by a method including the operations (a) and (b); and disposing at least one electrically conductive fiber within the electrode lead part of the valve metal element for an anode of the electrolytic capacitor unit, the fiber being longer than the thickness of the valve metal element for an anode.

The above two methods are characterized in that the through hole is formed in the electrode lead part of the valve metal element while the conductive particle or fiber is disposed within in the hole, by having the particle or fiber pierce the electrode lead part. This production method gives an electrolytic capacitor wherein the conductive particle or fiber closely contacts with the core of the valve metal element.

Further, the present invention provides a method for producing an electrolytic capacitor including:

producing an electrolytic capacitor unit by a method including the operations (a) and (b); and forming a stack by stacking a plurality of the electrolytic capacitor units in the thickness direction;

piercing the electrode lead parts of the valve metal elements for an anode of electrolytic capacitor units with at least one electrically conductive fiber, the fiber being longer than the thickness of the stack of the electrolytic capacitor units; and separating the stack into a piece of electrolytic capacitor by cutting the electrically conductive fiber.

This method makes it possible to have one or more electrically conductive fibers pierces a plurality of electrode lead parts of the valve metal elements of the electrolytic capacitor units, at a time. Therefore, according to this method, an electrolytic capacitor wherein an electrically conductive fiber is disposed within the electrode lead part of the valve element can be produced with a higher productivity.

Any of the above-described methods for producing the electrolytic capacitor may further include bringing at least one electrically particle into contact with the core of the valve metal element for an anode, by disposing the particle on the electrode lead part of the valve metal element followed by pressurizing. In this operation, the pressurization is performed so that a part of each conductive particle pierces the dielectric oxide film on the electrode lead part and reaches the core, and the other part is positioned above the surface of the dielectric oxide film, in other words, so that the particle is projected from that surface. That is, the pressurization is performed so that a part of each conductive particle is buried in the electrode lead part. These additional operations make it possible to produce an electrolytic capacitor wherein electrically conductive particle(s) contacts with the core of the valve metal element for an anode at the electrode lead part in which the through hole(s) is formed.

Alternatively, any of the above-mentioned methods for producing the electrolytic capacitor may further includes: bringing at least one electrically conductive particles into contact with the core of the valve metal element for an anode, by disposing an electrically conductive resin composition containing the particle(s) and an uncured thermosetting resin on the electrode lead part of the valve metal element and then by pressurizing; and bonding the electrically conductive resin composition to the electrode lead part of the valve metal element for an anode by a heat treatment. The pressurization is performed in the same manner as described above, so that a part of the electrically conductive particle is buried in the electrode lead part. These operations make it possible to produce an electrolytic capacitor wherein conductive particle(s) contacts with the core of the valve metal element in the electrode lead part in which the through hole(s) is formed, and fixed to the electrode lead part with a thermosetting resin.

Alternatively, any of the above-described methods for producing the electrolytic capacitor may further include: applying an electrically conductive resin composition containing metal powder and a thermosetting resin to the electrode lead part of the valve metal element for an anode; and bonding the conductive resin composition to the electrode lead part of the valve metal element for an anode by heat treatment. These operations makes it possible to produce an electrolytic capacitor wherein a layer of an electrically conductive resin composition containing metal powder and a thermosetting resin is formed on a surface of the electrode lead part wherein the through hole is formed.

In the case where the layer of the conductive resin composition is formed on the electrode lead part of the valve metal element for an anode, the electrode lead part may be pressurized after the conductive resin composition has been applied thereto. In that case, the conductive resin composition can be bonded more strongly to the surface of the electrode lead part. The heat treatment and the pressurization may be conducted at the same time.

It is possible to form a layer of the conductive resin composition on a flat plate previously, and sandwich the electrode lead part of the valve metal element for an anode by the plates so as to transfer the conductive resin composition to the electrode lead part. In that case, the conductive resin composition is applied by the transfer. The electrode lead part is preferably pressurized at the time of the transfer in order to strengthen the adhesion of the conductive resin composition. In the case where the diameter of metal powder contained in the resin composition is larger than the thickness of the dielectric oxide film and a large pressure is applied, metal powder (i.e. particles) contacts with the core of the valve metal in the capacitor.

The present invention also provides a method for producing a circuit board with a built-in capacitor which includes:
preparing a first circuit board in which a wiring layer is formed in a predetermined wiring pattern on a surface of an electrically insulating layer;
preparing an electrically conductive adhesive containing an electrically conductive filler and an uncured thermosetting resin;
preparing a sheet member formed of a thermosetting resin composition containing an uncured thermosetting resin and an inorganic filler, as an electrically insulating substrate;
applying the electrically conductive adhesive to a predetermined position of a surface of the wiring layer of the first circuit board;
fixing the electrolytic capacitor of the present invention to the first circuit board (strictly, to the wiring layer of the first circuit board) by disposing the capacitor on the electrically conductive adhesive and then by curing the adhesive through a heat treatment; and
forming an electrically insulating layer within which the capacitor is disposed, by superposing the electrically insulating substrate on the first circuit board to which the electrolytic capacitor is fixed and then by heating and pressurizing, that is, forming an electrically insulating layer where the capacitor is built in. This is a method for producing a circuit board with a built-in capacitor in which an electrically insulating layer is formed on a first circuit board and the electrically insulating layer covers an electrolytic capacitor (that is, the capacitor is embedded in the electrically insulating layer), by fixing the capacitor to the first circuit board, and then superposing a sheet-like electrically insulating substrate thereon followed by heating and pressurization.

In the method for producing the circuit board with a built-in capacitor, the electrically insulating layer constituting the first circuit board is preferably formed of a thermosetting resin composition which constitutes the electrically insulating substrate. When the electrically insulating substrate and the first circuit board are made of the same material, the internal stress which generates upon the lamination and incorporation of the electrically insulating substrate, can be reduced. Thereby, a circuit board with a built-in capacitor with high connection reliability can be obtained.

The present invention provides a method for producing a circuit board with a built-in capacitor which includes:
preparing an electrically conductive adhesive containing an electrically conductive filler and an uncured thermosetting resin;
preparing a sheet member formed of a thermosetting resin composition containing an uncured thermosetting resin and an inorganic filler, as an electrically insulating substrate;
applying the electrically conductive adhesive to a predetermined position of a surface of a metal foil;
fixing the electrolytic capacitor of the present invention to the metal foil by disposing the capacitor on the electrically conductive adhesive and then by curing the adhesive through a heat treatment;

forming an electrically insulating layer within which the capacitor is disposed, by superposing the electrically insulating substrate on the metal foil to which the electrolytic capacitor is fixed and then by heating and pressurizing, and patterning the metal foil so as to form a wiring layer in a predetermined wiring pattern. The metal foil is preferably a copper foil.

In this production method, the electrolytic capacitor is fixed to a surface of the metal foil that is to be a wiring layer, and the electrically insulating substrate is superposed thereon. That is, in this production method, the step of disposing the electrolytic capacitor within the electrically insulating layer and the step of fabricating the circuit board having the wiring layer and the electrically insulating layer are conducted at the same time. Therefore, this production method does not require preparing a first wiring board previously, and therefore, gives a more miniature and thinner circuit board with a built-in capacitor. Further, this production method makes it possible to dispose the electrolytic capacitor adjacent to an external electrode of the circuit board, resulting in a circuit board with a built-in capacitor having an improved high-frequency responsibility.

The present invention also provides a method for producing a circuit board with a built-in capacitor which includes:

forming a wiring layer in a predetermined wiring pattern on one surface of a releasable carrier;

preparing an electrically conductive adhesive containing an electrically conductive filler and an uncured thermosetting resin;

preparing a sheet member formed of a thermosetting resin composition containing an uncured thermosetting resin and an inorganic filler, as an electrically insulating substrate;

applying the electrically conductive adhesive to a predetermined position of a surface of the wiring layer;

fixing the electrolytic capacitor of the present invention to the wiring layer on the carrier by disposing the capacitor on the applied adhesive and then by curing the adhesive through a heat treatment;

forming an electrically insulating layer within which the electrolytic capacitor is disposed, by superposing the electrically insulating substrate on the releasable carrier to which the electrolytic capacitor is fixed and then by heating and pressurizing; and exposing the wiring layer by removing the releasable carrier.

This production method also does not require a first circuit board to which the electrolytic capacitor is fixed, and therefore, enables production of a more miniature and thinner circuit board with a built-in capacitor having an improved high-frequency responsibility.

In any of the above-described methods for producing a circuit board with a built-in capacitor, the conductive adhesive is preferably applied by printing. Printing enables the conductive adhesive to be applied precisely only to a desired position.

Further, in any of the above-described methods for producing a circuit board with a built-in capacitor, it is preferable that an electrically insulating substrate is prepared wherein one or more through holes are formed in a predetermined position and the hole(s) is filled with a via paste containing electrically conductive powder and a thermosetting resin. The via paste is subjected to a heat treatment at an appropriate time (specifically, at the time when the electrically insulating substrate is superposed so as to form the electrically insulating layer) so that the thermosetting resin is cured to form an inner via. Therefore, this production method including this operation of preparing such a substrate makes it possible to produce a circuit board with a built-in capacitor wherein two wiring layers disposed on both surfaces of the electrically insulating substrate are connected as desired.

In the case where the through hole(s) is formed in the electrically insulating substrate and the hole(s) is filled with the via paste, the electrolytic capacitor is preferably disposed within the electrically insulating so that the via paste in the through hole contacts with the electrode lead part of the valve metal element for an anode of the capacitor. Thereby, the wiring layer placed on a surface of the electrically insulating substrate and the electrolytic capacitor are electrically connected through the inner via, and therefore, it is possible to produce a circuit board with a built-in capacitor wherein the wiring length is shorter and a lower connection resistance is realized.

The electrolytic capacitor of the present invention is an element which does not have a molding resin and lead frames, and characterized in that through hole(s) is formed in the electrode lead part of the valve metal element for an anode to expose the core of the valve metal. The surface of the exposed core serves as a connection portion which can be connected to other member (particularly, a wiring board) with a low resistance. The electrolytic capacitor of the present invention provided with such a connection portion is suitable for being connected to a wiring layer of the wiring board using an electrically conductive adhesive. Further, since the electrolytic capacitor of the present invention is in the form of element, this capacitor can constitute a circuit board with a built-in capacitor which has a low height and a high reliability, and presents a low connection resistance.

Further, by incorporating the electrolytic capacitor of the present invention together with other components into a circuit board, a miniature module containing built-in components at a high density is given. Although the area needed for setting the module with built-in components of the present invention is small, this module fulfills many functions. Further, in this module, it is possible to shorten the wiring length and to dispose a semiconductor chip adjacent to the electrolytic capacitor, whereby the stray capacitance and the stray inductance are reduced. Therefore, the present invention gives a low-loss circuit board with a built-in component which functions as a desired circuit and has an excellent high-speed responsibility.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 13 is a graph illustrating ESR at 100 kHz of a circuit board wherein an electrolytic capacitor obtained in Example 1 is built-in;

DETAILED DESCRIPTION OF THE PREFERRED EMBODIMENTS

Hereinafter, embodiments of an electrolytic capacitor, a circuit board with a built-in capacitor, and an embodiment of a module with a built-in component together with the production methods, are described with reference to the drawings.

The fundamental configuration of the present invention is a solid electrolytic capacitor unit which includes a valve metal element for an anode including a capacitor forming part and an electrode lead part, a dielectric oxide film provided on a surface of the valve metal element for an anode, a solid electrolyte layer provided on the dielectric oxide film, and a charge collecting element for a cathode provided on the solid electrolyte layer. This corresponds to a conventional electrolytic capacitor. An electrolytic capacitor of the present invention is constituted by forming a through hole(s) in the electrode lead part of the valve metal element for an anode of this electrolytic capacitor unit so as to expose the core of the valve metal element outside.

Figure 1:
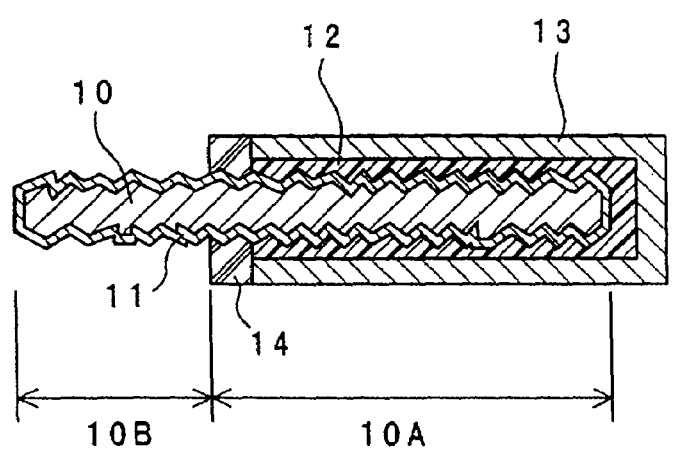
FIG. 1 shows a sectional view of a conventional electrolytic capacitor which corresponds to a fundamental electrolytic capacitor unit for constituting an electrolytic capacitor of the present invention.

A sectional view of the solid electrolytic capacitor which corresponds to the fundamental configuration of the present invention is shown in FIG. 1. In FIG. 1, numeral 10 denotes the valve metal element for an anode, numeral 10A denotes the capacitor forming part, and numeral 10B denotes the electrode lead part. Numeral 11 denotes the dielectric oxide film, numeral 12 denotes the solid electrolyte layer, and numeral 13 denotes the charge collecting element for a cathode. Numeral 14 denotes an insulator which ensures the insulation between the anode and the cathode.

For example, a foil or a sintered body made of a material selected from aluminum, tantalum and niobium may be used as the valve metal element for an anode 10. Aluminum is preferably used, since aluminum is available at a low cost and excellent in productivity. Surfaces of the valve metal element for an anode 10 are generally roughened by electrolytic etching in order to increase the surface area.

An electrically conductive polymer such as polypyrrole, polythiophene, or polyaniline may be used for forming the solid electrolyte layer 12. The solid electrolyte layer 12 preferably further contains a dopant so that the electroconductivity of the conductive polymer is increased to reduce the resistance. As the dopant, an ion from arylsulfonic acid such as an alkylnaphthalene sulfonic acid and para-toluenesulfonic acid, and an aryl phosphoric ion may be used.

As the charge collecting element for a cathode 13, an Ag paste layer with a carbon layer as an adhesive layer, a foil of Cu, Ni or Al, or the metal foil with a carbon layer on a surface which is to contact with the solid electrolyte layer 12, may be used.

The insulator 14 is preferably provided in order to ensure the insulation between the anode and the cathode to prevent a short circuit. As the insulator 14, for example, polyimide, polyamide, polyphenylene ether (PPE), polyphenylene sulfide (PPS) or polyphenylene oxide (PPO) may be used.

In the solid electrolytic capacitor shown in FIG. 1, only one electrode lead part 10B for the anode is formed. The fundamental configuration of the present invention may be a solid electrolytic capacitor which has a three-terminal configuration wherein two electrode lead parts for the anode are provided, or a four-terminal configuration wherein both of anode and cathode have two electrode lead parts. The embodiments described below are applicable to such capacitors.

Embodiment 1

Figure 2:
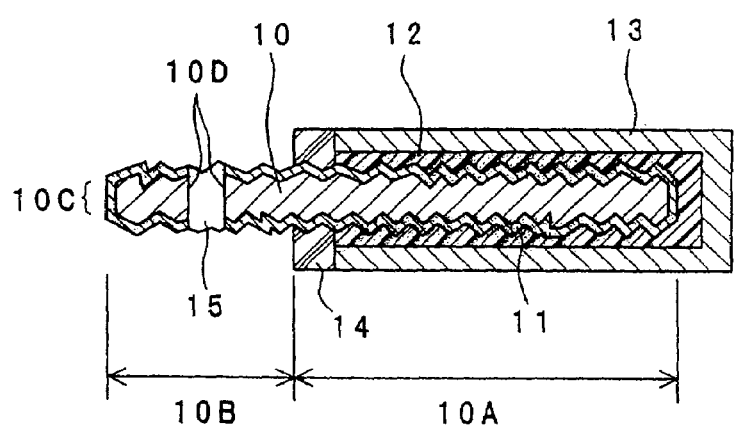
FIGS. 2(a) and 2(b) show a sectional view and a plan view of an embodiment of an electrolytic capacitor of the present invention, respectively.
Figure 2:
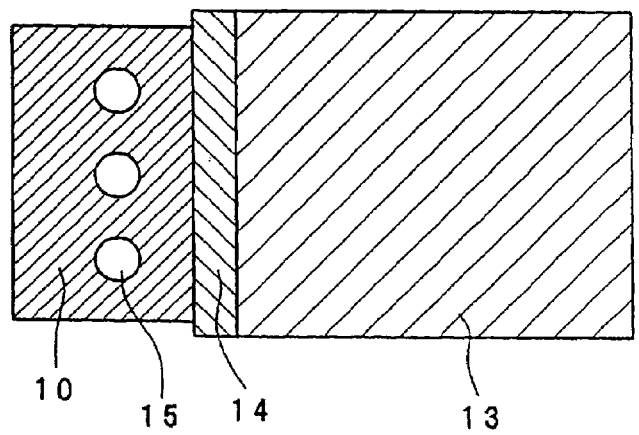

An embodiment of the electrolytic capacitor of the present invention is shown in FIGS. 2(a) and 2(b). FIG. 2(b) is a plan view of the electrolytic capacitor shown in FIG. 2(a). In FIGS. 2(a) and 2(b), numeral 10C denotes core of the valve metal element for an anode 10, and numeral 15 denotes a through hole. The inner exposed surface of the through hole 15 except for the portion of the dielectric oxide film 11 corresponds to the core-exposed portion 10D. In FIG. 2, the reference numerals which are identical to those used in FIG. 1 denote identical members or components described with reference to FIG. 1. Therefore, as to those members or components, the detailed description is omitted.

A method for producing the electrolytic capacitor of this embodiment is described with reference to FIG. 2. Firstly, a metal foil for the valve metal element for an anode is prepared. Herein, a case where an aluminum foil is used, is exemplified.

Firstly, the aluminum foil is subjected to electrolytic etching in an electrolytic solution which mainly contains hydrochloric acid, by applying alternating current to the Al foil. Thereby, surfaces of the aluminum foil are roughened to give the valve metal element for an anode 10 with fine concavities and convexities on the surfaces, as shown in FIG. 2(a). Next, the valve metal element for an anode 10 is subjected to anodic oxidation so that the dielectric oxide film 11 with a desired pressure resistance is formed on the surfaces. The dielectric oxide film 11 is generally formed into a thickness in the range of 1 to 20 nm. However, the thickness of the dielectric oxide film 11 is not limited to this range, and it is selected depending on the desired properties of the electrolytic capacitor. Next, a conductive polymer such as polypyrrole, polypyrrole, polythiophene, or polyaniline is formed by chemical polymerization or the combination of chemical polymerization and electrolytic polymerization, using a solution containing a dopant and a monomer. During the polymerization, the valve metal element for an anode 10 is masked except for the capacitor forming part 10A. The conductive polymer layer corresponds to the solid electrolyte layer 12.

Next, on both surfaces of the valve metal element for an anode 10, an insulator 14 is disposed at a border between the capacitor forming part 10A on which the solid electrolyte layer 12 is formed and the electrode lead part 10B. The insulator 14 is formed by bonding a tape of an appropriate electrically insulating material (such as a polyimide film) to the valve metal element. Subsequently, a carbon paste is applied to the surfaces of the solid electrolyte layer 12, followed by being cured. Next, an Ag paste is applied on the carbon paste layer, followed by being cured by heating. These carbon layer and Ag paste layer serve as the charge collecting element for a cathode 13. The carbon paste and Ag paste are applied by, for example, dipping. Alternatively, the charge collecting element for a cathode 13 may be formed by laminating a metal foil such as a Cu, Ni, or Al foil. In that case, the metal foil is bonded to the solid electrolyte layer 12 using the carbon paste.

Next, defect repair treatment of the dielectric oxide film 11 and the insulating treatment of the solid electrolyte layer 12 are conducted. Specifically, the treatments are conducted by applying a predetermined voltage in a high-temperature and high-humidity atmosphere (for example, 85° C. and 80% RH), followed by drying. When the treatments are completed, the electrolytic capacitor of the configuration shown in FIG. 1 is obtained.

Next, the through hole 15 is formed in the electrode lead part 10B of the valve metal element for an anode so that the unoxidized core 10C of the valve metal element for an anode is exposed outside, whereby the electrolytic capacitor of the present invention having the core-exposed portion 10D as shown in FIG. 2(a) can be obtained. The through hole 15 may be formed using, for example, a NC punching machine. Alternatively, the through hole 15 may be formed by a method wherein a punching die is used, or by a YAG laser. The diameter of the through hole 15 is, for example, from 30 to 300 µm. However, the size of the through hole 15 is not limited to this range. Further, a plurality of through holes 15 are preferably formed. FIG. 2(b) shows an electrolytic capacitor-wherein three through holes 15 are formed, as one example. As the number of the through holes 15 is increased, the capacitor is connected to a wiring layer with a lower connection resistance, resulting in a low-loss circuit board with a built-in capacitor and a low-loss module with a built-in components, and an improved connection reliability. However, as the number of the through holes 15 is increased, the strength of the electrode lead part 10 becomes lower. Therefore, it is necessary to select the number of the through holes 15 so that the electrolytic capacitor is not broken by a force which is applied upon producing the circuit board with a built-in capacitor. Generally, the number of the through holes 15 is preferably in the range of 1 to 8 per 1 mm².

In the above-described method, the through hole 15 is formed in the electrode lead part 10B of the valve metal element for an anode 10 after the electrolytic capacitor as shown in FIG. 1 has been fabricated. Alternatively, the through hole 15 may be formed after the. dielectric oxide film 11 has been formed, and thereafter the solid electrolyte layer 12 and the charge collecting element for a cathode 13 may be formed. In such a method, since the through hole is formed before the electrolytic capacitor unit is completed, a workpiece can be handled without concern about the damage of the solid electrolyte layer and so on when forming the through hole.

Embodiment 2

Figure 3:
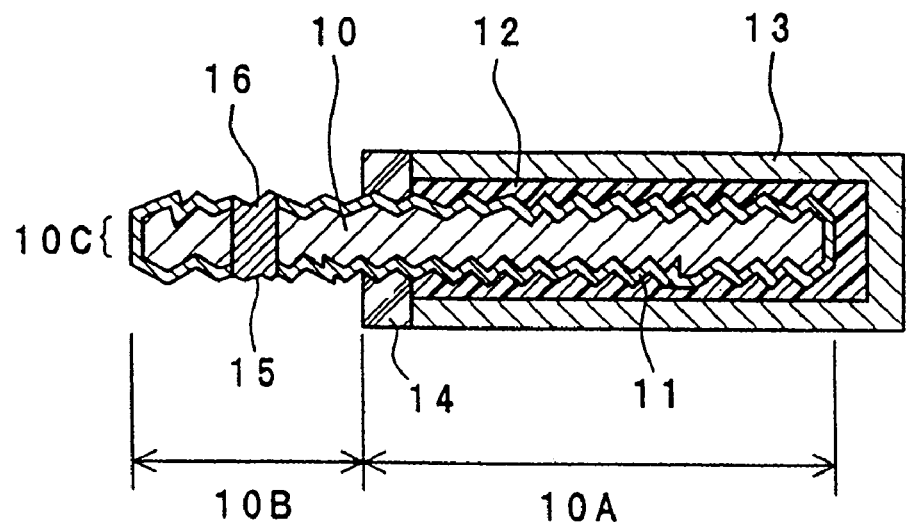
FIG. 3 shows a sectional view of another embodiment of an electrolytic capacitor of the present invention.

Another embodiment of the electrolytic capacitor of the present invention is shown in FIG. 3. In FIG. 3, numeral 16 denotes an electrically conductive resin composition containing metal powder and a thermosetting resin, which resin fills the through hole 15 and is electrically connected to the core 10C of the valve metal element for an anode 10. In FIG. 3, the reference numerals which are identical to those used in FIGS. 1 and 2 denote identical members or components described with reference to FIGS. 1 and 2. Therefore, as to those members or components, the detailed description is omitted.

A method for producing the electrolytic capacitor of this embodiment is described with reference to FIG. 3. Firstly, the electrolytic capacitor with the through hole as shown in FIG. 2 is fabricated by the method as described in connection with Embodiment 1.

Metal powder and a thermosetting resin are mixed to give an electrically conductive resin composition. The metal powder is preferably made of a metal that is excellent in conductivity and stability. For example, a metal or an alloy powder of which major component is Ag, Cu, Au, Ni, Co or Pd may be preferably used. Particularly, Ag or Cu powder, or powder made by an alloy containing Ag or Cu may be preferably used. The diameter of the metal powder is preferably in the range of 0.1 to 100 µm. The thermosetting resin in an uncured state is mixed with the metal powder. For example, an epoxy resin, a phenol resin or a polyimide resin can be used as the thermosetting resin. These resin is preferably used because of high reliability. The uncured thermosetting resin is preferably mixed in an amount of 30 to 150 parts by volume with the 100 parts by volume of the metal powder. Further, the conductive resin composition may further contain a curing agent, a curing catalyst, a surface active agent and/or a coupling agent.

Next, the through hole 15 is filled with the conductive resin composition. A method for filling the through hole includes, for example, a method employing a screen printing and a method employing a dispenser. The conductive resin composition 16 is then connected to the core 10C of the valve metal element for an anode 10 in the through hole 15, by heat treatment for curing the thermosetting resin in the resin composition 16. As a result, the electrolytic capacitor of the present invention as shown in FIG. 3 is obtained.

The temperature and time for the heat treatment are not limited to particular ones as long as the properties of the capacitor is not deteriorated due to thermal decomposition of the solid electrolyte layer 12. The heat treatment temperature is generally in the range of 80 to 180° C., and the heat treatment time is generally in the range of 5 to 30 minutes. After completing this heat treatment, the treatments for repairing the defection in the dielectric oxide film 11 and insulating the solid electrolyte layer 12 are preferably performed.

In this embodiment, the diameter of the through hole 15 is preferably from 0.5 to 2 times the thickness of the valve metal element for an anode 10. The reason is as described above. The valve metal element for an anode 10 is preferably formed of a metal foil of a thickness of 40 to 150 µm in order to reduce the height of the circuit board with a built-in capacitor. Therefore, when the metal foil of such a thickness is used, the diameter of the through hole is selected from the range of 20 to 300 μm depending on the thickness of the foil.

The cross-sectional shape of the through hole 15 is not limited to circle, and may be any of square, rectangular, and oval. When the cross-sectional shape of the through hole 15 is not circle, the preferable size of the through hole is defined by a minimum value and a maximum value of the diametrical distance between two arbitrary points on the outline of the cross-section of the through hole. Specifically, the minimum value is preferably longer than 0.5 times the thickness of the valve metal element for an anode, and the maximum value is preferably is less than 2 times the thickness of the valve metal element for an anode. Further, also in this embodiment, a plurality of through holes 15 may be formed and filled with the conductive resin composition.

Furthermore, in this embodiment, it is preferable that the electrode lead part 10B of the valve metal element for an anode 10 is pressurized after the through hole 15 has been filled with the conductive resin composition 16. This pressurization step strengthens the connection of the metal powder contained in the conductive resin composition 16 in the through hole 15 to the core 10C, resulting in the reduction of the connection resistance. A pressurization method is not limited to a particular one. The pressurization may be conducted, for example, by pressing with flat plates, or by using compressed air. The pressurization and the heat treatment may be conducted at the same time.

In this embodiment of the electrolytic capacitor, the conductive resin composition serves as the connection portion of the anode, since the conductive resin composition contacts with the core of the valve metal element for an anode. Therefore, the electrolytic capacitor of this embodiment can be easily connected to a wiring board without inserting, for example, an electrically conductive adhesive into the through hole.

Embodiment 3

Figure 4:
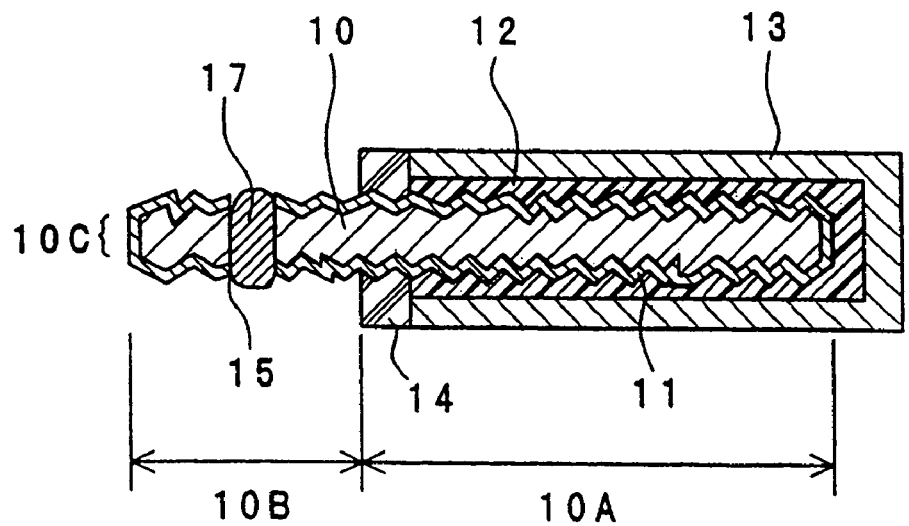
FIG. 4 shows a sectional view of further another embodiment of an electrolytic capacitor of the present invention.

Another embodiment of the electrolytic capacitor of the present invention is shown in FIG. 4. In FIG. 4, numeral 17 denotes an electrically conductive particle. This conductive particle is disposed in the through hole 15 and contacts with the core 10C of the valve metal element for an anode 10 to be electrically connected to the core. In FIG. 4, the reference numerals which are identical to those used in FIGS. 1 to 3 denote identical members or components described with reference to FIGS. 1 to 3. Therefore, as to those members or components, the detailed description is omitted.

A method for producing the electrolytic capacitor of this embodiment is described with reference to FIG. 4. Firstly, the solid electrolytic capacitor unit of the fundamental configuration as shown in FIG. 1 is fabricated by the method as described in connection with Embodiment 1.

The conductive particle 17 is prepared of which diameter is larger than the thickness of the valve metal element for an anode 10. Next, the conductive particle 17 is disposed on the electrode lead part 10B of the valve metal element for an anode 10, followed by being pressurized so as to be disposed within the valve metal element for an anode 10, whereby the through hole 15 is formed and the conductive particle 17 contacts with the core of the valve metal element for an anode 10. As a result, the electrolytic capacitor as shown in FIG. 4 is obtained.

As the conductive particle 17, a particle of a high conductivity is used which has a hardness that enables the particle to pierce the valve metal element for an anode 10 without the break of the particle upon pressurization. Specifically, a particle made of a metal or an alloy of which main component is selected from Ag, Cu, Ni, Pd, Pt and Au, may be used. The conductive particle 17 has a diameter which is larger than the thickness of the valve metal element for an anode 10, and preferably has a diameter which is 1.0 to 1.2 times the thickness of the valve metal element for an anode 10, and more preferably has a diameter which is 1.05 to 1.2 times the thickness of the valve metal element for an anode 10. In the case where the conductive particle of such a diameter is disposed within the valve metal element for an anode, the upper and the lower end portions of the particle are projected from the surfaces of the capacitor, whereby the capacitor is advantageously connected to other member (such as a wiring board). A pressurization method is not limited to a particular one. For example, a pressing can be employed for piercing the valve metal element for an anode with the conductive particle 17.

In the electrolytic capacitor of this embodiment, the conductive particle can serve as the connection portion of the anode, since the particle contacts with the core of the valve metal element for an anode. Therefore, the electrolytic capacitor of this embodiment can be easily connected to a wiring board similarly to Embodiment 2.

The above-described method makes it possible to form the through hole easily. In an alternative method, the through hole is previously formed as described in connection with Embodiment 1, and an electrically conductive particle of which diameter is slightly larger than the diameter of the through hole is pressed into the through hole, whereby the electrolytic capacitor as shown in FIG. 4 can be obtained.

As a variant of this embodiment, there is an embodiment wherein a plurality of conductive particles 17 are disposed within the valve metal element for an anode 10 at a plurality of positions. The electrolytic capacitor of such an embodiment enables the connection resistance to be further reduced when connecting the capacitor to the wiring board.

Embodiment 4

Figure 5:
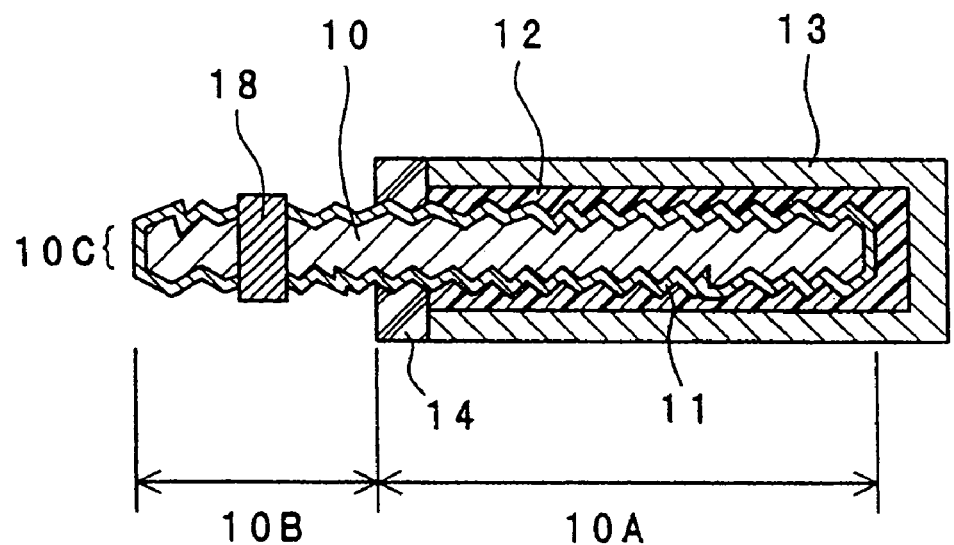
FIG. 5 shows a sectional view of still further another embodiment of an electrolytic capacitor of the present invention.

Another embodiment of the electrolytic capacitor of the present invention is shown in FIG. 5. In FIG. 5, numeral 18 denotes an electrically conductive fiber. This conductive fiber 18 is disposed in the through hole 15 and contacts with the core 10C of the valve metal element for an anode 10 to be electrically connected to the core. In FIG. 5, the reference numerals which are identical to those used in FIGS. 1 to 4 denote identical members or components described with reference to FIGS. 1 to 4. Therefore, as to those members or components, the detailed description is omitted.

A method for producing the electrolytic capacitor of this embodiment is described with reference to FIG. 5. Firstly, the solid electrolytic capacitor unit of the fundamental constitution as shown in FIG. 1 is fabricated by the method as described in connection with Embodiment 1.

The conductive fiber 18 is prepared which is longer than the thickness of the valve metal element for an anode 10. Next, the conductive fiber 18 is made to pierce the electrode lead part 10B of the valve metal element for an anode 10 so that the through hole 15 is formed and the conductive fiber 18 contacts with the core of the valve metal element for an anode 10. As a result, the electrolytic capacitor as shown in FIG. 5 is obtained.

The conductive fiber 18 is made of a metal material which has a high conductivity and can be worked into a fiber or a thin wire. Specifically, as the conductive fiber 18, a fiber or a thin wire which is obtained by working a metal or an alloy of which main component is selected from the group consisting of Ag, Cu, Ni, Pd, Pt, Au and Al, can be used. The conductive fiber 18 has a length larger than the thickness of the valve metal element for an anode 10, and preferably has a length which is 1.0 to 1.2 times the thickness of the valve metal element for an anode 10, and more preferably has a length which is 1.05 to 1.2 times the thickness of the valve metal element for an anode 10. In the case where the conductive fiber of such a length is disposed within the valve metal element for an anode, the upper and the lower end portions of the fiber are projected from the surfaces of the capacitor, whereby the capacitor is advantageously connected to other member (such as a wiring board). The diameter of the conductive fiber 18 is preferably in the range of 20 to 200 μm. A method for making the conductive fiber 18 pierce the valve metal element is not limited to a particular one. The conductive fiber 18 can pierce the valve metal element for an anode by being pressurized by means of, for example, a pressing machine, a wire bonder or an ultrasonic.

In the electrolytic capacitor of this embodiment, the conductive fiber can serve as the connection portion of the anode, since the fiber contacts with the core of the valve metal element for an anode. Therefore, the electrolytic capacitor of this embodiment can be easily connected to a wiring board similarly to Embodiment 2.

The above-described method makes it possible to form the through hole easily. In an alternative method, the through hole is previously formed as described in connection with Embodiment 1, and an electrically conductive fiber with a diameter slightly larger than the diameter of the through hole and a length larger than the thickness of the valve metal element for an anode is pressed into the through hole, whereby the electrolytic capacitor as shown in FIG. 4 can be obtained.

As a variant of this embodiment, there is an embodiment wherein a plurality of conductive fibers 18 pierce the valve metal element for an anode 10 at a plurality of positions. The electrolytic capacitor of such an embodiment enables the connection resistance to be reduced when connecting the capacitor to the wiring board.

Embodiment 5

Figure 6:
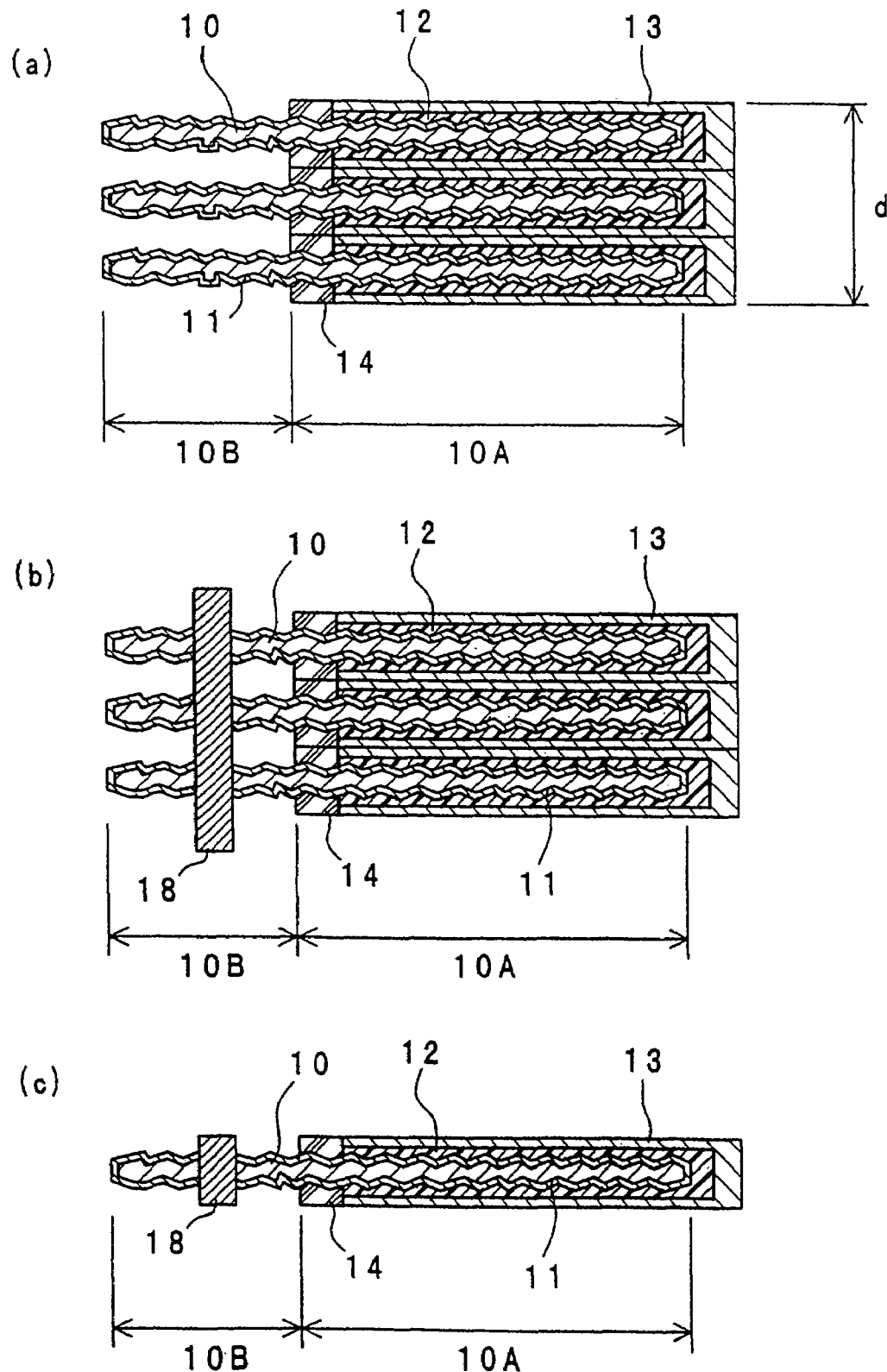
FIGS. 6(a) to 6(c) schematically show the steps for producing an electrolytic capacitor of the present invention.

Another method for producing the electrolytic capacitor of Embodiment 4 is described as Embodiment 5. In FIGS. 6(*a*) to 6(*c*), each step of the method is schematically shown in a sectional view. In FIG. 6, the reference numerals which are identical to those used in FIGS. 1 to 5 denote identical members or components described with reference to FIGS. 1 to 5. Therefore, as to those members or components, the detailed description is omitted.

Firstly, the solid electrolytic capacitor unit of the fundamental configuration as shown in FIG. 1 is fabricated by the method as described in connection with Embodiment 1. Next, a plurality of the solid electrolytic capacitor units are stacked so that the surface (that is, the surface which is vertical to the thickness direction of the metal foil that constitutes the valve metal element for an anode) is faced with each other, in other words, they are stacked in the thickness direction thereof (FIG. 6(*a*)). Thereby, the electrode lead parts 10B of the valve metal elements for an anode 10 of the electrolytic capacitor units coincide with each other (that is, align) in the thickness direction.

The conductive fiber 18 is prepared in the same manner as in the production of the electrolytic capacitor of Embodiment 4. In Embodiment 5, it is required that the conductive fiber 18 has a length which is longer than that entire thickness d of the stack of the solid electrolytic capacitor units. When the length of the conductive fiber 18 is shorter than d, the conductive fiber 18 may not surely pierce each electrode lead part 10B of each valve metal element for an anode 10 of each electrolytic capacitor unit.

Next, as shown in FIG. 6(*b*), the conductive fiber 18 is made to pierce the electrode lead parts 10B of the valve metal elements for an anode 10 of electrolytic capacitor units. The fiber is made to pierce the valve metal element by the method as described in connection with Embodiment 4. Next, the conductive fiber 18 is cut at each position between two electrode lead parts 10B of two valve metal elements for an anode 10 of two electrolytic capacitor units, so as to separate the capacitor into a piece. As a result, the electrolytic capacitor as shown in FIG. 6(*c*) can be obtained.

Also in this embodiment, a plurality of conductive fibers may pierce at a plurality of positions in each electrolytic capacitor unit. Further, also in this embodiment, the through hole may be previously formed in each electrolytic capacitor unit, and a conductive fiber with a diameter slightly larger than that of the through hole may be made to pierce this through hole. In that case, the through hole is formed in each electrolytic capacitor at a time after the electrolytic capacitor units have been stacked as shown in FIG. 6(*a*). Alternatively, the electrolytic capacitors with a through hole are stacked so that the through holes coincide with each other, and then the fiber is made to pierce the through holes.

In an alternative, the electrolytic capacitor of the embodiment as shown in FIG. 6(*b*) may be fabricated without cutting the conductive fiber, and may be used as a component for a circuit board. The electrolytic capacitor of such an embodiment has a large capacitance depending on the number of the stacked electrolytic capacitors. Therefore, this production method is modified so as to obtain an electrolytic capacitor of a desired capacitance by optimally selecting the number of the solid electrolytic capacitor units of the fundamental configuration.

Embodiment 6

Figure 7:
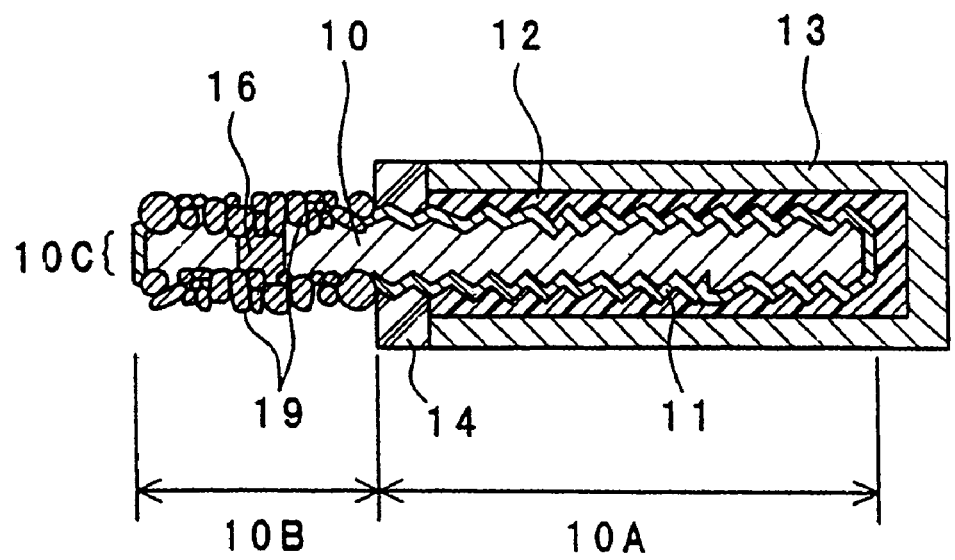
FIG. 7 shows a sectional view of another embodiment of an electrolytic capacitor of the present invention.

Another embodiment of the electrolytic capacitor of the present invention is shown in FIG. 7. In FIG. 7, numeral 19 denotes an electrically conductive particle. The electrolytic capacitor shown in FIG. 7 corresponds to the capacitor shown in FIG. 3 which further includes the conductive particles 19 that contact with the core of the valve metal element for an anode 10 over the electrode lead part 10B. In FIG. 7, the reference numerals which are identical to those used in FIGS. 1 to 6 denote identical members or components described with reference to FIGS. 1 to 6. Therefore, as to those members or components, the detailed description is omitted.

A method for producing the electrolytic capacitor of this embodiment is described with reference to FIG. 7. Firstly, the electrolytic capacitor as shown in FIG. 3 is fabricated by the method as described in connection with Embodiment 2.

The conductive particles 19 are prepared and disposed on the electrode lead part 10B of the valve metal element for an anode 10 followed by being pressurized. Thereby, the conductive particles 19 pierce the dielectric oxide film 11 formed on the valve metal element for an anode 10 to contact with the core 10C of the valve metal element for an anode 10. When a plurality of conductive particles 19 are used, it is not necessarily required that all of the conductive particles contact with the core 10C of the valve metal element for an anode 10. The electrical connection between the core portion 10C and the conductive particle which does not contact with the core 10C is indirectly ensured, if this particle contacts with another particle which contacts with the core 10C. Further, the conductive particles 19 preferably pierce the portion which has concavities and convexities resulted from the surface roughening treatment such as etching (that is, a roughened layer) so as to contact with a portion of the core which portion is not affected by the surface roughening treatment. The roughened layer is a region in the thickness direction which contains concavities and convexities formed by the surface roughening treatment. When the valve metal element for an anode is cut in a direction perpendicular to the thickness direction in sequence, a cut surface of the valve metal element for an anode becomes a plane where concavities and convexities are not observed, in due time. This plane corresponds to the border between the roughened layer and the portion which is not affected by the surface roughening treatment. Generally, the thickness of the roughened layer (that is, the distance in the thickness direction between the top of the highest convexity and the bottom of the deepest concavity) is in the range of 20 to 100 μm.

As the conductive particle 19, for example, the particles as described in connection with Embodiment 3 may be used. However, different from Embodiment 3, the conductive particles 19 pierce only the dielectric oxide film 11 and do not pierce the entire thickness of the valve metal element for an anode 10. For this reason, it is preferable that the conductive particle 19 has a diameter which is larger than the thickness of the dielectric oxide film 11 and is smaller than the thickness of the valve metal element for an anode 10. For example, when a plurality of conductive particles 19 are used, at least one conductive particle 19 preferably has a diameter of 30 to 70 μm. The conductive particle of such a diameter pierces the dielectric oxide film and the roughened layer to directly contact with the portion of the core 10C of the valve metal element for an anode 10 which portion is not affected by the surface roughening treatment. When at least one particle has a diameter in the above range, the other particles have a diameter less than 30 μm, and may be in the range of 0.1 to 30 μm. However, it should be noted that a specific and preferable range of particle diameter depends on the thickness of the valve metal element for an anode and the thickness of the dielectric oxide film.

The conductive particles 19 are preferably disposed so that they cover the entire of both surfaces of the electrode lead part 10B, as shown in FIG. 7. Alternatively, the conductive particles 19 may be disposed so as to cover the entire of one surface of the electrode lead part 10B. Alternatively, the conductive particles 19 may be disposed so as to cover a part of one surface or a part of both surfaces of the electrode lead part 10B.

In a variant of this embodiment, at least a part of the conductive particle is covered with a thermosetting resin. In a method for producing an electrolytic capacitor of such an embodiment, the conductive particles are mixed with an uncured thermosetting resin to give an electrically conductive resin composition, and the resin composition is applied to the electrode lead part so as to dispose the conductive particles on the electrode lead part. The application is conducted by a printing, dipping, or a method wherein a dispenser is used. Next, the conductive particles are brought into contact with the core of the valve element for an anode by pressurization, and then the thermosetting resin is cured by a heat treatment so that the resin composition adheres to the electrode lead part. In the electrolytic capacitor of this embodiment, since the conductive particles are fixed by the thermosetting resin more strongly, the conductive particles are less liable to fall out, resulting in higher connection reliability between the conductive particles and the core of the valve element for an anode. The thermosetting resin is not limited to a particular one. For example, an epoxy resin, a phenol resin, a polyimide resin, or an isocyanate resin may be used. The uncured thermosetting resin is preferably mixed in an amount of 25 to 100 parts by volume with conductive particles of 100 parts by volume.

In an alternative method, the conductive resin composition containing the conductive particles and the uncured thermosetting resin is applied to a desired position on a flat plate, and the electrode lead part of the valve metal element for an anode is sandwiched by these two plates so as to transfer the resin composition to the electrode lead part. In that case, the conductive resin composition is applied by the transfer. In that case, conductive particles can be brought into contact with the core of the valve element for an anode by pressurizing the plates upon transferring the resin composition to the electrode lead part. Further, the thermosetting resin is cured at the same time by conducting a heat treatment and the pressurization at the same time. Therefore, the transfer by means of plates is a preferable technique since the disposition (that is, application) of the conductive resin composition and the fixation of the conductive particles can be conducted at the same time.

In the electrolytic capacitor shown in FIG. 7, the through hole 15 is filled with the conductive resin composition. This embodiment is not limited to one shown in FIG. 7, and may be applied to any of the embodiments shown in FIGS. 2, 4 and 5. In any case, the conductive particles may be previously brought into contact with the core of the valve metal element for an anode, and then the through hole may be made, and further, the conductive resin composition may be optionally filled into the through hole or the conductive particle or the conductive fiber may be optionally disposed within the through hole.

Embodiment 7

As Embodiment 7, a configuration in which the electrode lead part of the valve metal element for an anode is coated with an electrically conductive resin composition containing metal powder and a thermosetting resin in the electrolytic capacitor as described in connection with Embodiments 1 to 5, is described together with a method for producing the capacitor of such a configuration.

The conductive resin composition as described in connection with Embodiment 2 is preferably prepared also as the conductive resin composition used for coating in this embodiment. Therefore, the detailed description is omitted.

The conductive resin composition is applied to a surface of the electrode lead part of the valve metal element for an anode by an appropriate method. As an application method, a screen printing method, a dipping method or a method wherein a dispenser is used may be employed. Thereafter, the conductive resin composition is subjected to a heat treatment so that the uncured thermosetting resin is cured and the resin composition adheres to the surface of the electrode lead part of the valve metal element for an anode. The temperature and time for head treatment are not limited to particular ones, and the conditions as exemplified in connection with Embodiment 2 may be employed. When the electrolytic capacitor of this embodiment is produced, the treatments for repairing the defection in the dielectric oxide film and insulating the solid electrolyte layer are preferably performed in the same manner as in Embodiment 1 after the conductive resin composition resin has been applied.

Further, the electrode lead part of the valve metal element for an anode is preferably pressurized after the conductive resin composition has been applied to the surface of the electrode lead part. By the pressurization, the adhesion strength and the electrical connection between the conductive resin composition and the electrode lead part are improved.

In an alternative method, the conductive resin composition may be applied to a desired position on a flat plate, and the electrode lead part of the valve metal element for an anode is sandwiched by these two plates so as to transfer the resin composition to the electrode lead part, whereby the resin composition is applied. In that case, the flat plates may be pressurized upon transferring the resin composition to the electrode lead part. Further, the pressurization and a heat treatment may be conducted at the same time, whereby the conductive resin composition is applied and bonded to the electrode lead part at the same time. In this manner, the transfer by means of plates has an advantage that the application, the pressurization, and the heat treatment can be conducted in fewer steps.

Embodiment 8

As Embodiment 8, a method for producing a circuit board with a built-in capacitor using the electrolytic capacitor of the present invention is described. In FIGS. 8(a) to 8(d), each step of the method is schematically shown in a sectional view.

Firstly, a summary of the procedures for producing the circuit board with a built-in capacitor of the present invention is described with reference to FIG. 8. In the preparatory step, 1) a first circuit board 22 with a wiring layer 21 in a predetermined wiring pattern on its surface, and 2) an electrically conductive adhesive 23 containing an electrically conductive filler and an uncured thermosetting resin are prepared. Further, 3) a sheet member formed of a thermosetting resin composition containing an uncured thermosetting resin and an inorganic filler is prepared as an electrically insulating substrate 25. In the electrically insulating substrate 25, through hole 27 is optionally formed in a desired position, and the through hole 27 is filled with a via paste 26 containing conductive powder and an uncured thermosetting resin.

The conductive adhesive 23 is applied to a desired position on a surface of the wiring layer 21 of the prepared first circuit board 22. Next, an electrolytic capacitor 24 of the present invention (corresponding to one shown in FIG. 3) is disposed on the conductive adhesive 23, and then the adhesive 23 is cured by a heat treatment. As a result, the electrolytic capacitor 24 is fixed and electrically connected to the wiring layer 21, as shown in FIG. 8(a).

Next, the electrically insulating substrate 25 and a copper foil 28 are superposed on the first circuit board 22 to which the electrolytic capacitor 24 is attached, as shown in FIG. 8(b), and then a pressurization and a heat treatment are conducted. Thereby, as shown in FIG. 8(c), the electrically insulating substrate 25 adheres to the surface of the first circuit board 22 to give an electrically insulating layer 29 and to dispose the electrolytic capacitor 24 within the electrically insulating layer 29 (that is, to incorporate the capacitor 24 into the electrically insulating layer 29). Further, by these pressurization and heat treatment, the via paste 26 is cured to form an inner via 30. Next, the copper foil 28 is subjected to patterning to form a wiring layer 21a in a predetermined wiring pattern, and thereby the circuit board with a built-in capacitor as shown in FIG. 8(d) is completed.

The first circuit board 22 is not limited to a particular one. For example, a printed-circuit board such as a glass-epoxy board, a paper-phenol board, and an aramid-epoxy board, and a ceramic board such as an alumina board and a glass-alumina board can be used. A material for the wiring layer 21 is appropriately selected depending on the type of the circuit board. For example, a copper foil may be used for the printed-circuit board, and a sintered body formed of metal powder of Cu, Ag, Pd, Mo or W may be used for the ceramic board. The number of the wiring layers 21 contained in the first circuit board 22 is not limited to a particular one. A multilayer circuit board as shown in FIG. 8 as well as the double-faced circuit board wherein the wiring layer is formed only on both surfaces (that is, the number of the wiring layers are two), may be used.

In the first circuit board 22, the electrically insulating layers are preferably formed of the same material as that of the electrically insulating substrate 25. In the case where the material for the electrically insulating layer is selected in this manner, the electrically insulating layers in the finally obtained circuit board with a built-in capacitor are made of the same material, which enables the internal stress due to lamination of different materials to be eliminated or reduced. Thereby connection reliability of the circuit board with a built-in capacitor is more improved.

The electrically conductive filler which constitutes the electrically conductive adhesive 23 is not limited to a particular one as long as it is a stable particle of a low specific resistance and a low contact resistance. Specifically, powder made of a metal or an alloy of which main component is Ag, Cu, Au, Ni, Pd or Pt may be used as the conductive filler. Particularly, Ag or Cu powder, or powder of an alloy containing Ag or Cu is preferably used. As the uncured thermosetting resin which constitutes the conductive adhesive 23, for example, an epoxy resin, a phenol resin, a polyamide resin or a polyamide-imide resin may be used. These resins are preferably used because of high reliability. The thermosetting resin is preferably mixed in an amount of 30 to 150 parts by volume with the conductive filler of 100 parts by volume. The conductive adhesive 23 may further contain one or more additives selected from a curing agent, a curing catalyst, a surface active agent, a coupling agent and a lubricant.

The conductive adhesive 23 is obtained by mixing the conductive filler and the uncured thermosetting resin. As a mixing method, a method using three rolls, or a method using a planetary mixer may be employed. Alternatively, the commercially available conductive adhesive 23 may be used.

As a method for applying the conductive adhesive 23 to a desired position on the surface of the wiring layer 21 of the first circuit board 22, a printing method or a method using a dispenser may be employed. In terms of productivity, a metal mask printing method is preferably employed. The heat treatment which follows the placement of the electrolytic capacitor 24 on the conductive adhesive 23 is conducted at a temperature at which the thermosetting resin contained in the adhesive can be cured. The heat treatment is preferably conducted at a temperature in the range of 80 to 180° C. for 5 to 30 minutes. When the temperature is too high, the solid electrolyte layer in the electrolytic capacitor is thermally decomposed to affect the properties of the capacitor adversely.

The electrically insulating substrate 25 may be produced carrying out the following procedures. Firstly, a predetermined amount of the uncured thermosetting resin and an inorganic resin are metered and mixed. A mixing method is not limited to a particular one. For example, a method using a planetary mixer, a ball mill method using ceramic balls, or a method using a planetary stirring machine may be used. Next, the obtained thermosetting resin composition is worked into a sheet. A method for working the resin composition into a sheet is not limited to a particular one, and may be selected depending on the condition of the thermosetting resin composition. Specifically, a method using a doctor blade, an extrusion method, a method using a curtain coater, or a method using a roll coater may be employed. Particularly, the method using a doctor blade or the extrusion method is preferably employed because they are simple.

The thermosetting resin contained in the electrically insulating substrate 25 is, for example, an epoxy resin, a phenol resin, an isocyanate resin or a polyamide-imide resin. These resins are preferably used because of high reliability. As the inorganic filler, a filler made of, for example, $Al_2O_3$, $SiO_2$, SiC, AlN, BN, MgO or $Si_3N_4$ is preferably used. Particularly, since the filler made of $Al_2O_3$ or $SiO_2$ is easily mixed with the thermosetting resin, the electrically insulating substrate which is produced using such a filler can contain the filler in a higher content. Further, in the case where the filler made of $Al_2O_3$, SiC, or AlN is used, the thermal conductivity of the electrically insulating substrate 25 is improved, resulting in higher heat releasability of the electrically insulating layer 29 in the circuit board with a built-in capacitor. A mixture of two or more types of fillers of different materials may be used as the inorganic filler. A particulate inorganic filler of which diameter is in the range of 0.1 to 100 µm, is preferably used. In the material constituting the electrically insulating substrate, the thermosetting resin is generally mixed in an amount of 20 to 200 parts by volume with the inorganic filler of 100 parts by volume. However, the amount of the thermosetting resin is not limited to this range.

The electrically insulating substrate 25 may further contain one or more additives selected from a curing agent, a curing catalyst, a coupling agent, a surface active agent, and a colorant. Further, the viscosity of the mixture may be adjusted by adding a solvent upon mixing the inorganic filler and the thermosetting resin, depending on the method for working the mixture into a sheet member. As the solvent used for adjusting the viscosity, methyl ethyl ketone (MEK), isopropanol or toluene may be used. In the case where such a solvent is added, it is necessary to remove the solvent by a drying treatment after the thermosetting resin composition has been worked into the sheet member. The drying treatment is not limited to a particular technique as long as the treatment is conducted at a temperature below the curing-start temperature of the thermosetting resin.

When the through hole 27 is formed in the electrically insulating substrate 25, the through hole may be formed by means of, for example, a NC punching machine or carbon dioxide laser. Alternatively, the through hole may be formed by a perforation method using a metal die.

The via paste 26 is made by mixing electrically conductive powder and the uncured thermosetting resin. They are mixed by the same method as that employed for producing the conductive adhesive 23. As the conductive powder, powder made of a metal or an alloy of which main component is Ag, Cu, Au, Ni, Pd or Pt, or an alloy thereof. Particularly, Ag or Cu powder, or powder of an alloy containing Ag or Cu is preferably used. As the uncured thermosetting resin, for example, an epoxy resin, a phenol resin, an isocyanate resin a polyamide resin or a polyamide-imide resin may be used. These resins are preferably used because of high reliability. The thermosetting resin is preferably mixed in an amount of 30 to 150 parts by volume with the conductive powder of 100 parts by volume. Further, a curing agent, a curing catalyst, a lubricant, a coupling agent, a surface active agent, a high boiling solvent and/or a reactive diluent may be further added to the via paste 26.

A method for filling the though hole 27 with the via paste is not limited to a particular one. For example, a screen printing method may be applied.

In the step of FIG. 8(b), the temperature of pressurization and heating is properly selected so that the thermosetting resin contained in the electrically insulating substrate 25 can be cured and the solid electrolyte layer of the electrolytic capacitor 24 is not adversely affected. The temperature is preferably in the range of 120 to 200° C. The pressurization and heating is conducted under a pressure which is properly selected so that the electrolytic capacitor 24 is disposed within (i.e. buried in) the electrically insulating substrate 25, and the electrically insulating substrate 25 becomes a layer adhering to the first circuit board 22 so as to make an electrical connection between the wiring layer 21 and the copper foil 28 through the inner via 30. The pressure is preferably selected from a range of 0.1 to 3 MPa.

The copper foil 28 constitutes the wiring layer 21a in the finally obtained circuit board with a built-in capacitor. The thickness of the copper foil 28 is selected so that the wiring layer 21a has a desired thickness. The thickness of the copper foil 28 is generally in the range of 9 to 35 µm. A method for patterning the copper foil 28 is not limited to a particular one. The copper foil is patterned, for example, by a chemical etching using an aqueous solution of iron chloride or copper chloride. Another metal foil such as a nickel foil or an aluminum foil may be substituted for the copper foil 28 when needed.

Figure 8:
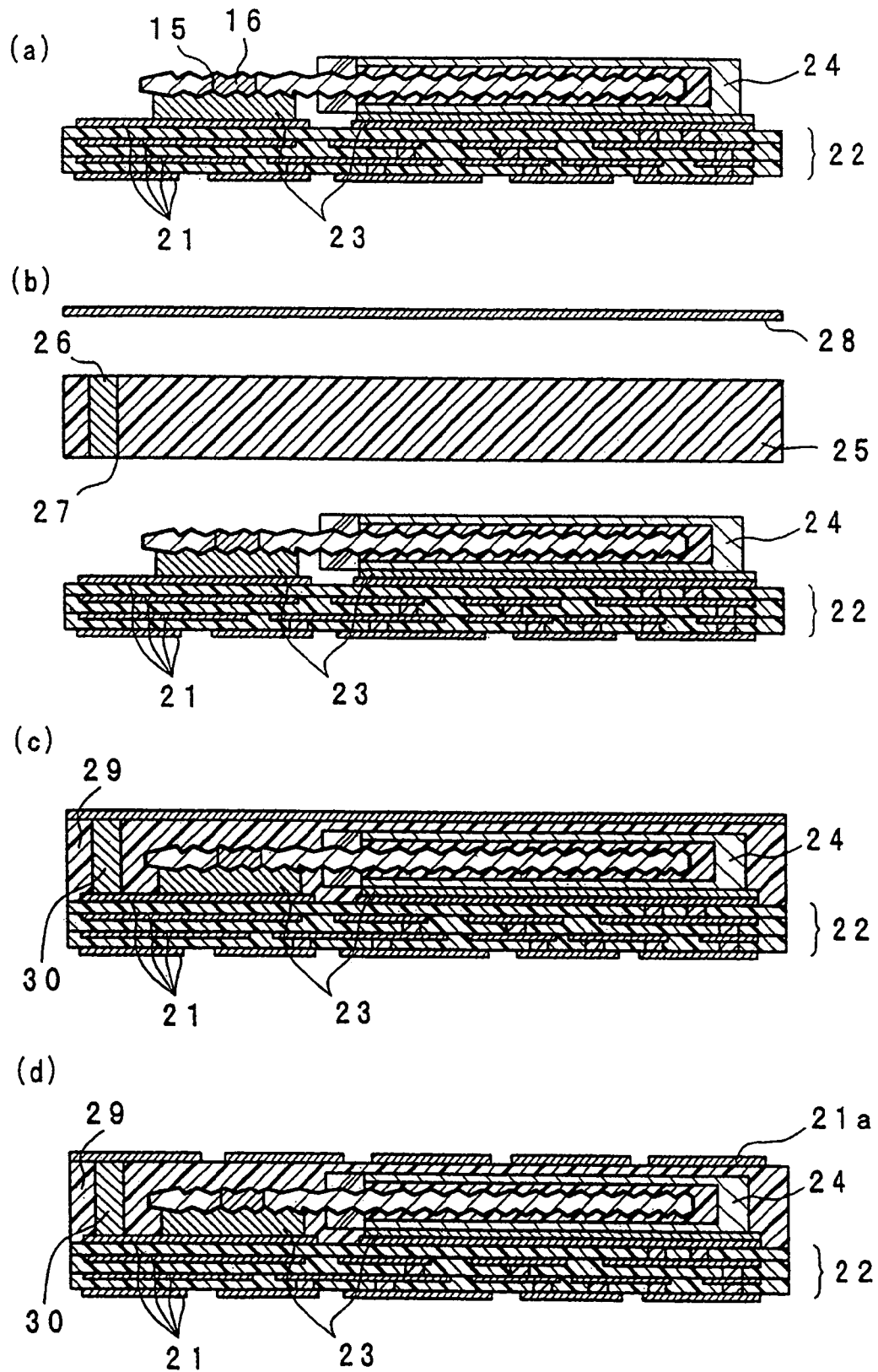
FIGS. 8(a) to 8(d) schematically show sectional views illustrating the steps in an embodiment of a method for producing a circuit board with a built-in electrolytic capacitor of the present invention.

In FIG. 8, the electrically insulating substrate 25 is a single sheet member. In another embodiment, the electrically insulating substrate 25 may be a laminate of the sheet members of the similar type. In that case, the thickness of the electrically insulating substrate 25 can be adjusted as desired by selecting the number of the laminated sheet members. Further, the electrically insulating substrate may be superposed and subjected to a heating and pressurization treatment after an unnecessary portion(s) has been removed (for example, cut away, or drawn out) according to need. In that case, the position accuracy of the inner via is favorably improved.

In each step shown in FIG. 8, the electrolytic capacitor shown in FIG. 3 is used as the electrolytic capacitor 24. The built-in electrolytic capacitor is not limited to this, and any of the capacitors as described above may be used.

Particularly, when the electrolytic capacitor as shown in FIG. 3 is used, it is preferable that the metal powder contained in the conductive resin composition 16 and the conductive filler contained in the conductive adhesive 23 are made of the similar type of metal or alloy. In that case, the contact resistance between the conductive resin composition 16 and the conductive adhesive 23 can be suppressed, and the connection reliability is improved. Further, in the case where an electrically conductive resin composition covers a surface of the electrode lead part of the valve metal element for an anode in the electrolytic capacitor, as described in Embodiment 8, it is preferable that the metal powder contained in this resin composition and the conductive filler contained in the conductive adhesive 23 are made of the similar type of metal or alloy. In any case, the metal powder and the conductive filler are preferably made of Cu, Ag, or an alloy containing Cu or Ag.

In FIG. 8(b), the electrically insulating substrate 25 and the copper foil 28 are superposed on the upper surface of the electrolytic capacitor 24. In a variant of this embodiment, a second circuit board is substituted for the copper foil 28. In that case, the patterning step of FIG. 8(d) is not required. The configuration wherein the second circuit board is superposed on the first circuit board makes it possible not only to form an electrically insulating layer which includes a built-in electrolytic capacitor, but also to form circuit patterns for rewiring above and below the electrically insulating layer. Therefore, this configuration is preferably employed since the circuit board with a built-in capacitor is designed more freely, and the wiring is contained at a higher density. As the second circuit board, a circuit board similar to the first circuit board 22 shown in FIG. 8 may be employed. The second circuit board preferably has an electrically insulating layer which is composed of the same material as that of the electrically insulating substrate 25. Further, two circuit boards disposed above and below the electrolytic capacitor are preferably of the similar type, so that warpage and internal stress which are caused upon fabricating the circuit board with a built-in capacitor, can be reduced.

Embodiment 9

Figure 9:
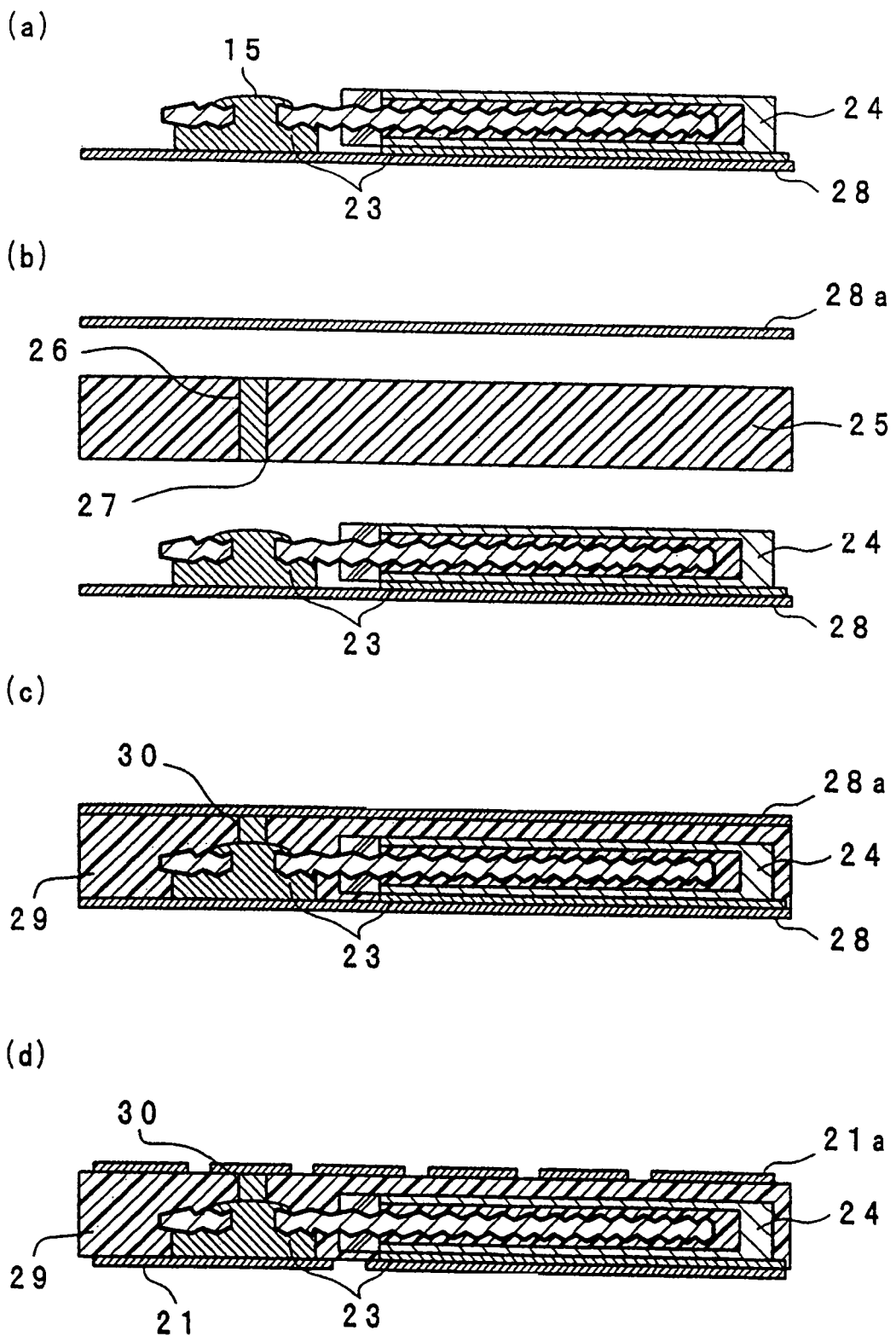
FIGS. 9(a) to 9(d) schematically show sectional views illustrating the steps in another embodiment of a method for producing a circuit board with a built-in electrolytic capacitor of the present invention.

As Embodiment 9, another method for producing a circuit board with a built-in capacitor using the electrolytic capacitor of the present invention is described. In FIGS. 9(a) to 9(d), each step of the method is schematically shown in a sectional view. In FIG. 9, the reference numerals which are identical to those used in FIG. 8 denote identical members or components described with reference to FIG. 8. Therefore, as to those members or, components, the detailed description is omitted.

The electrically conductive adhesive 23 and the electrically insulating substrate 25 which are prepared in the preparatory stage are as described in connection with Embodiment 8. In this embodiment, the electrically insulating substrate 25 has the through hole 27 filled with the via paste 26.

In this embodiment, the conductive adhesive 23 is applied to a desired position of a surface of the copper foil 28. Next, the electrolytic capacitor 24 of the present invention (which corresponds to one shown in FIG. 1) is disposed on the conductive adhesive 23, and the conductive adhesive 23 is made to enter into the through hole 15 followed by being cured by a heat treatment. As a result, the electrolytic capacitor 24 is fixed and electrically connected to the copper foil 28, as shown in FIG. 9(a).

Next, the electrically insulating substrate 25 and another copper foil 28a are superposed on the copper foil 28 to which the electrolytic capacitor is attached, followed by being heated and pressurized, as shown in FIG. 9(b). Thereby, the electrically insulating layer 29 which adheres to the copper foil 28 is formed and the electrolytic capacitor 24 is disposed within (that is, incorporated into) the electrically insulating layer 29. Further, by this heating and pressurization, the via paste is cured to form the inner via 30. Next, the two copper foils 28 and 28a are patterned into a predetermined wiring pattern to give wiring layers 21 and 21a, whereby the circuit board with a built-in capacitor as shown in FIG. 9(d) is completed.

In this embodiment, there is no circuit board (which corresponds to the circuit board 22 in FIG. 8) for supporting the electrolytic capacitor 24. For this reason, the thickness of the finally obtained circuit board with a built-in capacitor can come close to the thickness of the electrolytic capacitor 24 itself, resulting in a low-height circuit board with a built-in capacitor. Further, in the circuit board with a built-in capacitor, since the distance between the electrolytic capacitor 24 and the outermost wiring layer 21 is short, a lower resistance and ESL are achieved, which makes it possible to realize an excellent high-speed responsibility.

In FIG. 9, as the electrolytic capacitor 24, the capacitor of Embodiment 1 as described with reference to FIG. 2 is used. As shown in FIG. 9(a), the electrolytic capacitor 24 and the copper foil 28 are electrically connected by the conductive adhesive 23 that enters into the through hole 15 of the electrolytic capacitor 24 and contacts with the core of the valve metal element for an anode. The electrolytic capacitor 24 is not limited to this embodiment, and any of the capacitors as described above may be used.

Further, in this embodiment, as shown in FIG. 9(b), the electrically insulating substrate 25 is disposed so that the via paste 26 contacts with the electrode lead part of the valve metal element for an anode of the electrolytic capacitor 24. As a result, the inner via 30 is positioned just above the through hole 15 of the electrolytic capacitor 24. By this configuration, the inner via 30 can be brought into direct contact with the electrode lead part of the electrolytic capacitor 24 and with the conductive adhesive 23 via the through hole 15, which enables the wiring to be shortened and the resistance to be reduced. In this configuration, the conductive powder contained in the inner via 30 and the conductive filler contained in the conductive adhesive 23 is preferably made of the similar type of metal or alloy.

In the case where the electrolytic capacitor is any of the embodiments as shown in FIGS. 3 to 7, the conductive component located within the through hole (that is, the metal powder contained in the conductive resin composition, or the conductive particle or the conductive fiber), the conductive powder contained in the inner via and the conductive filler contained in the conductive adhesive are preferably made of the similar type of metal or alloy. In other words, in the connection region where the electrolytic capacitor and other component or element are connected, it is preferable that the materials of the conductive components are standardized or unified, whereby the resistance of the circuit board with a built-in capacitor is further reduced.

A method for producing the conductive adhesive 23, a method for applying the conductive adhesive 23, a method for producing the electrically insulating substrate 25, a method for forming the through hole 27, a method for producing the via paste 26, a method for filling the through hole 27 with the via paste 26, and a method for patterning the copper foils 28 and 28a are as described above in connection with Embodiment 8. Therefore, the detailed description thereof is omitted. A stack of the copper foil 28a/the electrically insulating substrate 25/the copper foil 28 is heated and pressurized by employing the method for heating and pressurizing the stack of the copper foil 28/the electrically insulating substrate 25/the first circuit board 22 which method is as described in connection with Embodiment 8.

Embodiment 10

Figure 10:
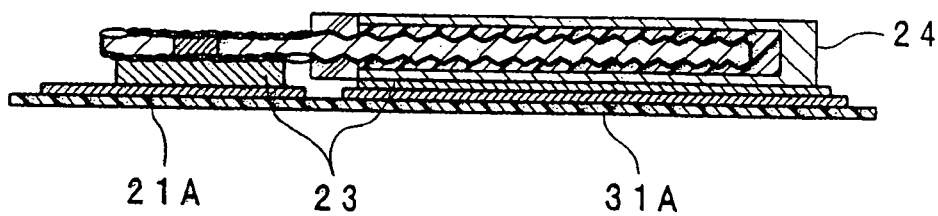
FIGS. 10(a) to 10(d) schematically show sectional views illustrating the steps in further another embodiment of a method for producing a circuit board with a built-in electrolytic capacitor of the present invention.
Figure 10:
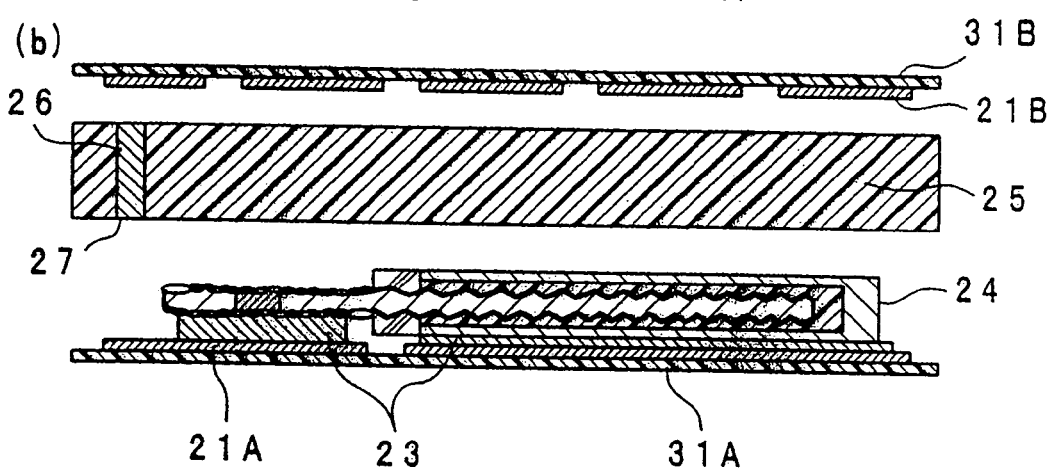
Figure 10:
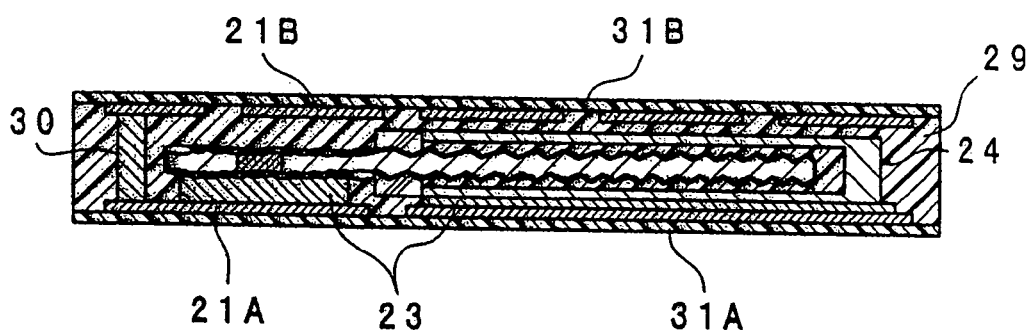
Figure 10:
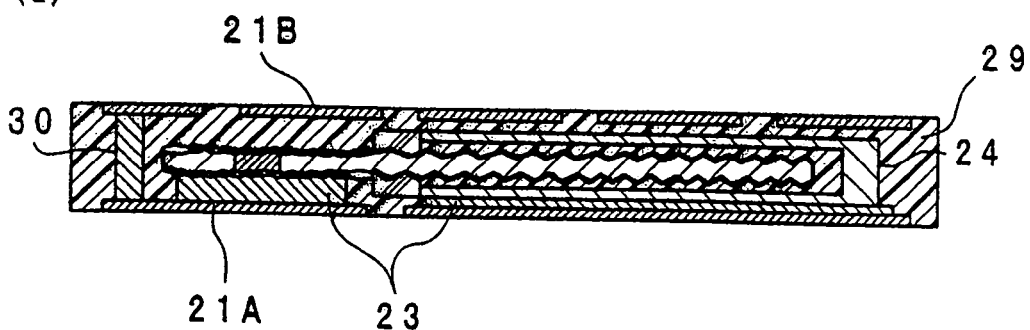

As Embodiment 10, another method for producing a circuit board with a built-in capacitor using the electrolytic capacitor of the present invention is described. In FIGS. 10(a) to 10(d), each step of the method is schematically shown in a sectional view. In FIG. 10, numeral 31 denotes a releasable carrier. In FIG. 10, the reference numerals which are identical to those used in FIGS. 8 and 9 denote identical members or components described with reference to FIGS. 8 and 9. Therefore, as to those members or components, the detailed description is omitted.

Firstly, a summary of the procedures for producing the circuit board with a built-in capacitor of the present invention is described with reference to FIG. 10. A copper foil is superposed on a surface of a releasable carrier 31A followed by being etched so as to form a wiring layer 21A in a predetermined wiring pattern. Further, the electrically conductive adhesive 23 is prepared in the same manner as in Embodiment 8. Next, the conductive adhesive 23 is applied to a desired position of the surface of the wiring layer 21A formed on the releasable carrier 31A. On the conductive adhesive 23, the electrolytic capacitor 24 (corresponding to one shown in FIG. 7) is disposed, and thereafter the conductive adhesive 23 is cured by a heat treatment. As a result, the electrolytic capacitor 24 is fixed and electrically connected to the wiring layer 21A, as shown in FIG. 10(a).

Next, the electrically insulating substrate 25 and another releasable carrier 31B with a wiring layer 21B formed thereon are superposed on the releasable carrier 31A, as shown in FIG. 10(b), followed by being subjected to heating and pressurization. The releasable carrier 31B is disposed so that the wiring layer 21B contacts with the electrically insulating substrate 25. Thereby, as shown in FIG. 10(c), the electrically insulating substrate 25 adheres to the wiring layers 21A and 21B formed on the releasable carriers 31A and 31B respectively, to form the electrically insulating layer 29, while the electrolytic capacitor 24 is disposed within (that is, incorporated into) the electrically insulating layer 29. Further, by this heating and pressurization, the via paste 26 is cured to form the inner via 30. Thereafter, the releasable carriers 31A and 31B are removed so as to expose the wiring layers 21A and 21B, whereby the circuit board with a built-in capacitor as shown in FIG. 10(d) is completed.

As the releasable carriers 31A and 31B, a sheet member which enables a wiring layer to be formed on its surface and is not damaged by the heating and pressurization treatment, is used. For example, a metal foil such as a copper foil and an aluminum foil, and a film made of a resin such as polyphenylene sulfide (PPS), polyethylene terephthalate (PET), polyimide and polyethylene may be used as the releasable carriers 31A and 31B.

The wiring layer 21A is formed on the surface of the releasable carrier 31A by a method wherein an appropriate metal foil is superposed on the surface of the releasable carrier 31A and bonded to the carrier by pressurization and/or heating, followed by being subjected to patterning by etching. In this method, in order to increase the adhesion strength between the releasable carrier and the metal foil, an adhesive layer may be formed on the surface of the releasable carrier and the metal foil may be superposed on the adhesive layer. The adhesive layer is removed after the releasable carrier has been removed. Alternatively, the adhesive layer may be maintained on the releasable carrier and peeled off together with the releasable carrier. The adhesive layer is formed of, for example, a silicone resin. Alternatively, the wiring layer 21A is formed on the surface of the releasable carrier 31A or the adhesive layer, by plating the surface with an appropriate metal (such as, copper) and patterning the plated metal by etching. The laminate wherein the wiring layer 21B is formed on the surface of the releasable carrier 31B is formed in the same manner.

In this embodiment, there is no circuit board for supporting the electrolytic capacitor 24 (which corresponds to the first circuit board 22 in FIG. 8), similarly to Embodiment 9. Therefore, in the circuit board obtained in this embodiment, the wiring length is shortened and the height is lowered, resulting in improvement in the high-speed responsibility of the circuit board. Further, in this embodiment, the wiring layer with a predetermined wiring pattern is previously formed on the surface of the releasable carrier. For this reason, the circuit board with a built-in capacitor which gives the above effects is more easily produced and a higher productivity is achieved. Furthermore, in this embodiment, since the electrolytic capacitor is not affected by the patterning step, the electrolytic capacitor is less damaged during the production of the circuit board. In addition, by employing the method of this embodiment, the surface of the wiring layer flushes with the surface of the electrically insulating layer, which increases the adhesion strength between the wiring layer and the electrically insulating layer, and therefore, the wire is difficult to exfoliate.

The laminate wherein the wiring layer is formed on the surface of the releasable carrier can be called as a wiring transfer sheet and it is conventionally used in the production of the wiring board. In the production of the circuit board with a built-in capacitor of the present invention, the conventional wiring transfer sheet may be used as long as the electrolytic capacitor of the present invention is bonded to the wiring layer with the conductive adhesive in the manner as described above.

A method for producing the conductive adhesive 23, a method for applying the conductive adhesive 23, a method for producing the electrically insulating substrate 25, a method for forming the through hole 27, a method for producing the via paste 26 and a method for filling the through hole 27 with the via paste 26 are as described above in connection with Embodiment 8. Therefore, the detailed description thereof is omitted. In the step of FIG. 10(b), a stack of the releasable carrier 31B/the electrically insulating substrate 25/the releasable carrier 31A is heated and pressurized by applying the method for heating and pressurizing the stack of the copper foil 28/the electrically insulating substrate 25/the first circuit board 22 which method is as described in connection with Embodiment 8.

Embodiment 11

Figure 11:
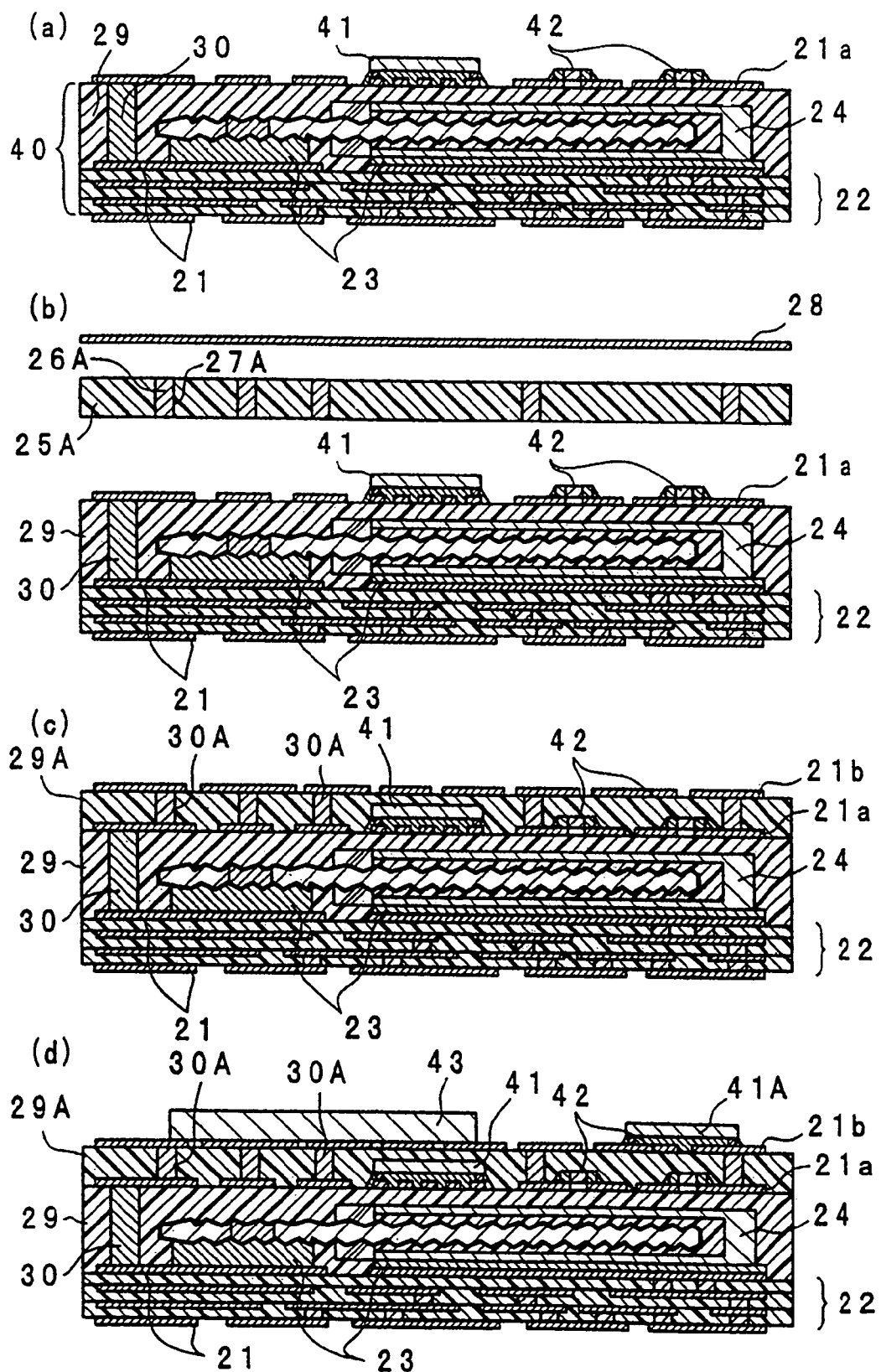
FIGS. 11(a) to 11(d) schematically show the steps in a method for producing a module with built-in components of the present invention.

As Embodiment 11, a module with a built-in component and a method for producing the same are described. In FIGS. 11(a) to 11(d), each step of the method is schematically shown in a sectional view. In FIG. 11, numeral 41 denotes a semiconductor chip, numeral 42 denotes a chip component, and numeral 43 denotes an inductor. In FIG. 11, the reference numerals which are identical to those used in FIGS. 8 to 10 denote identical members or components described with reference to FIGS. 8 to 10. Therefore, as to those members or components, the detailed description is omitted.

Firstly, the circuit board with a built-in capacitor 40 as shown in FIG. 8(d) is produced by the method of Embodiment 8. Next, the semiconductor chip 41 and the chip component 42 are mounted on the wiring layer 21a of this circuit board 40, as shown in FIG. 11(a). Next, as shown in FIG. 11(b), the electrically insulating substrate 25A and the copper foil 28 are superposed on the circuit board with a built-in capacitor 40 on which the semiconductor chip 41 and the chip components 42 are mounted, in the same manner as described in connection with Embodiment 8, and then subjected to heating and pressurization. This electrically insulating substrate 25A has a plurality of through holes 27, and each of the through holes 27 are filled with the via paste 26A.

By the heating and pressurization, the electrically insulating substrate 25A is bonded to the circuit board 41 to form the electrically insulating layer 29A and the semiconductor chip 41 and the chip components 42 are disposed within (that is, incorporated into) the electrically insulating layer 29A. Further, by this heating and pressurization, the via paste 26A is cured to form the inner via 30A. This inner via 30A electrically connects the wiring layers 21a and 21b. The wiring layer 21b is a layer which is formed by patterning the copper foil 28 into a predetermined wiring pattern.

Further, another semiconductor chip 41A and the inductor 43 are mounted on the wiring layer 21b, whereby the module with a built-in component as shown in FIG. 11(d) is completed.

The semiconductor chip 41 is preferably mounted by a flip-chip method. By employing the flip-chip method, the module is advantageously thinned, and the semiconductor chip 41 can be connected to the circuit board with a wiring length shortened, whereby the high-speed responsibility of the module with a built-in component is more improved. The built-in chip component 42 is not limited to a particular one. For example, a conventional chip resistor, chip capacitor and chip inductor may be built in as the chip component 42. Further, the chip component may be mounted using an electrically conductive adhesive, similarly to the electrolytic capacitor, or using an alloy solder.

The module with a built-in component makes it possible to dispose the semiconductor chip and the chip component near the low-height electrolytic capacitor that is connected with a low resistance, resulting in an electric circuit of a low resistance, a low stray capacitance and a low inductance. Therefore, this module with a built-in component is of a low loss, and excellent in high-frequency responsibility. Further, many components can be mounted at a high density in this module, which enables the module to have a small area and many functions.

In the configuration shown in FIG. 11, the semiconductor chip 41 and the chip components 42 are disposed within the electrically insulating layer. The components disposed within the electrically insulating layer are not limited to these. For example, an inductor and/or one or more other capacitors may be disposed within the electrically insulating layer.

Embodiment 12

Figure 14:
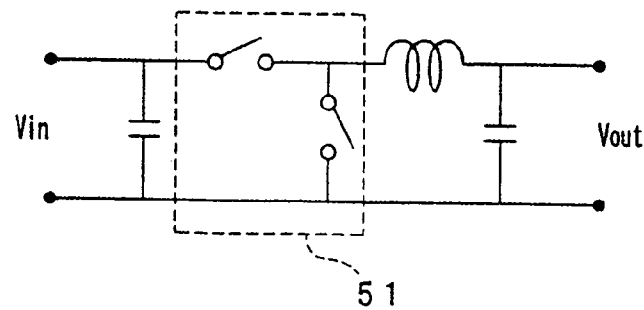
FIG. 14 shows a schematic circuit diagram of the electric circuit of a switching power supply module of the present invention.
Figure 15:
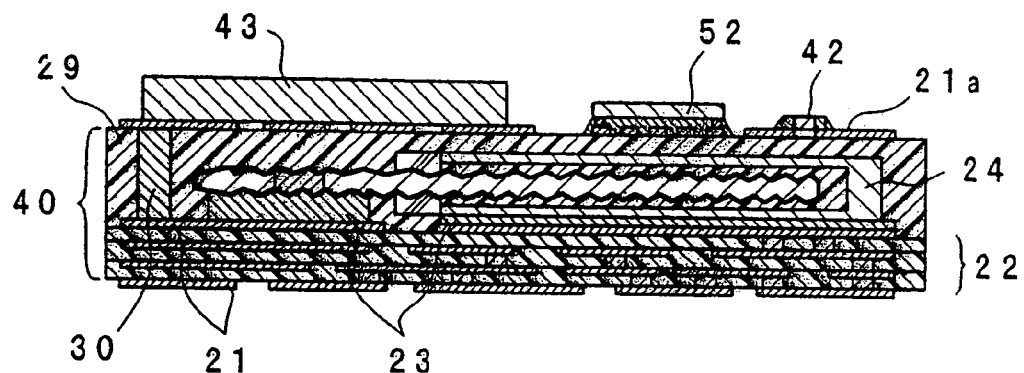
FIG. 15 shows a sectional view of an embodiment of a switching power supply module of the present invention.

As Embodiment 12, a switching power supply module of the present invention is described. In FIG. 14, a circuit of a DC/DC converter module which is one of the switching power supply modules of the present invention is schematically shown. In FIG. 14, the portion denoted by numeral 51 corresponds to a switching element. Further, in FIG. 15, the switching power supply module of the present invention is schematically shown in a sectional view. In FIG. 15, numeral 52 denotes a switching element. In FIG. 15, the reference numerals which are identical to those used in FIGS. 8 to 11 denote identical members or components described with reference to FIGS. 8 to 11. Therefore, as to those members or components, the detailed description is omitted.

In the module shown in FIG. 15, the switching element 52, the chip component 42 and the inductor 43 are mounted on the wiring layer 21a of the circuit board with a built-in capacitor 40. In the embodiment shown in FIG. 15, the circuit board with a built-in capacitor 40 is fabricated by the method of Embodiment 8. The switching element 52 is preferably mounted by a flip-chip method. The chip component 42 and the inductor 43 are mounted using an electrically conductive adhesive or an alloy solder.

In the switching power supply module of this embodiment, the switching element is placed near the electrolytic capacitor of a large capacitance and a low height which is connected with a low resistance. For this reason, this switching power supply module can handle a large power density, and operates at a low loss. Further, in the switching power supply module of this embodiment, the switching element and the capacitor are connected with a wiring length shortened, resulting in formation of an electric circuit of a low inductance. Therefore, this switching power supply module is excellent in high-speed responsibility, and stable with a low ripple voltage.

In the embodiment shown in FIG. 15, only the electrolytic capacitor 24 is disposed within the electrically insulating layer. In another embodiment, other components such as an inductor, a switching element and/or one or more other capacitors may be disposed within the electrically insulating layer.

Embodiment 13

Figure 16:
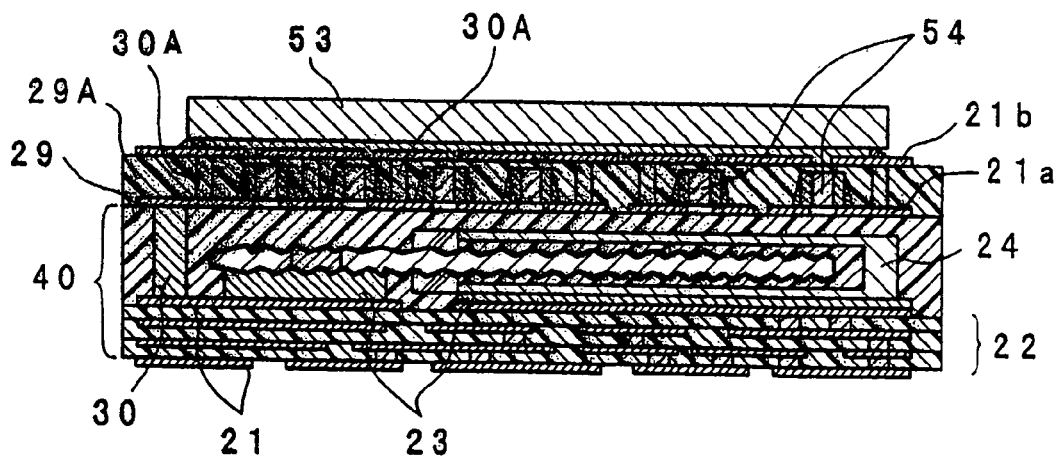
FIG. 16 shows a sectional view of an embodiment of a microprocessor module of the present invention.

As Embodiment 13, a microprocessor module of the present invention is described. In FIG. 16, the microprocessor module of the present invention is schematically shown in a sectional view. In FIG. 16, numeral 53 denotes a microprocessor, and numeral 54 denotes a chip capacitor 54. In FIG. 16, the reference numerals which are identical to those used in FIGS. 8 to 11 denote identical members or components described with reference to FIGS. 8 to 11. Therefore, as to those members or components, the detailed description is omitted.

In the microprocessor module of this embodiment, the chip capacitor 54 is disposed within the electrically insulating layer 29A that is placed above the wiring layer 21a of the circuit board with a built-in capacitor 40, and the microprocessor 53 is mounted on the wiring layer 21b formed on the electrically insulating layer 29A. Herein, the chip capacitor 54 serves as a decoupling capacitor, and it is properly selected depending on the frequency characteristics. The chip capacitor 54 is preferably a ceramic capacitor.

The microprocessor module of this embodiment is produced as follows. Firstly, the circuit board with a built-in capacitor 40 is fabricated by a method of Embodiment 8. Next, the chip capacitors 54 are mounted on the wiring layer 21a. The chip capacitors 54 may be mounted using an electrically conductive adhesive or an alloy solder. Next, an electrically insulating layer 29A with a built-in chip capacitors 54 is formed by superposing an electrically insulating substrate and a copper foil on the wiring layer 21a followed by heating and pressurization in the same manner as in Embodiment 11. The electrically insulating substrate has through holes filled with the via paste. The via paste is cured by the heating and pressurization to form the inner via 30A that connects the wiring layers 21a and 21b. The wiring layer 21b is formed by patterning the copper foil into a predetermined wiring pattern. Next, the microprocessor 53 is mounted on the wiring layer 21b, whereby the microprocessor module is obtained. The microprocessor 53 is preferably mounted by a flip-chip method as shown in FIG. 16, because the flip-chip method is advantageous for thinning the module. Alternatively, the microprocessor 53 may be mounted by a wire bonding method.

As shown in FIG. 16, the microprocessor 53 is preferably disposed so that the electrolytic capacitor 24 is placed just below the microprocessor 53. Thereby, the area required for setting the module can be reduced. Further, this arrangement shortens the distance between the microprocessor and the electrolytic capacitor, resulting in a microprocessor module excellent in high-speed responsibility.

In the microprocessor module of this embodiment, the microprocessor and the chip capacitors as decoupling capacitors are disposed near the low-height electrolytic capacitor which is connected with a low resistance. For this reason, the microprocessor and the decoupling capacitors can be connected with a low resistance and a low inductance. Therefore, this microprocessor module is excellent in high-speed responsibility and stability of power input. Further, this embodiment enables a plurality of capacitors to be mounted at a high density, resulting in a microprocessor module having a small area and high operation stability.

EXAMPLES

The following description will depict the present invention in more detail, referring to examples, but the present invention is not limited by the following examples.

Example 1

An aluminum foil with a thickness of 130 µm was prepared as an valve metal element for an anode, and a surface of the foil was roughened by electrolytic etching. The surface roughening was conducted by applying an alternating current to the aluminum foil in an electrolytic solution containing hydrochloric acid mainly at a concentration of 10 wt % at a liquid temperature of 35° C. The roughened layer thus formed had a thickness of 40 µm. Next, the aluminum foil was cut so that a 3 mm square region was formed. The square region corresponded to a capacitor forming part.

Next, the aluminum foil was subjected to constant voltage formation at a forming voltage of 8 V in a 5 wt % ammonium adipate aqueous solution at a liquid temperature of 60° C., so that the dielectric oxide film with a thickness of 7 nm was formed on surfaces of the valve metal element for an anode. Next, the capacitor forming part of the valve metal element for an anode was immersed in a solution containing a polythiophene monomer, an iron-based oxidant and a dopant, so that the solid electrolyte layer was formed by chemical polymerization. Next, the dielectric oxide film was repaired by conducting anodic oxidation again in an organic-solvent-based electrolytic solution.

Subsequently, a polyimide tape with a width of 0.5 mm was affixed as an insulator on a border between the capacitor forming part and the electrode lead part of the valve metal element for an anode, so that an anode portion was separated from the cathode portion. Next, a carbon paste was applied to the solid electrolyte layer and heated, so that a carbon layer was formed. Further, an Ag paste layer was formed by applying the Ag paste to the surface of the carbon layer, so that a charge collecting element for a cathode consisting of the carbon layer and the Ag paste layer was formed.

Next, the electrode lead part of the valve metal element for an anode was formed by punching with a punching die, so that a solid electrolytic capacitor unit as shown in FIG. 1 with an outside dimension of 3 mm×5 mm and a thickness of 0.23 mm was formed.

Ten through holes with a diameter of 0.15 mm were formed in the electrode lead part of the valve metal element for an anode of the obtained solid electrolytic capacitor unit, by means of a NC punching machine. Thereby, an electrolytic capacitor as shown in FIG. 2 was obtained.

For evaluating the obtained electrolytic capacitor, ten samples were fabricated and an ESR of each sample was determined. Each sample included the electrolytic capacitor which was mounted on a glass-epoxy wiring board. The electrolytic capacitor was mounted using an electrically conductive adhesive which was made by kneading 82 wt % Ag powder and 18 wt % epoxy resin by means of three rolls. The wiring layer of the glass-epoxy board was formed into a wiring pattern adapted to the electrode of the electrolytic capacitor. The mounting of the electrolytic capacitor was conducted by printing the conductive adhesive on a surface of the wiring layer using a metal mask, disposing the electrolytic capacitor on the printed adhesive, and heating at 150° C. for 15 minutes. For comparison, a sample was fabricated by mounting the electrolytic capacitor unit that did not have the through holes on the glass-epoxy board in the same manner. Ten samples for comparison were prepared.

Figure 12:
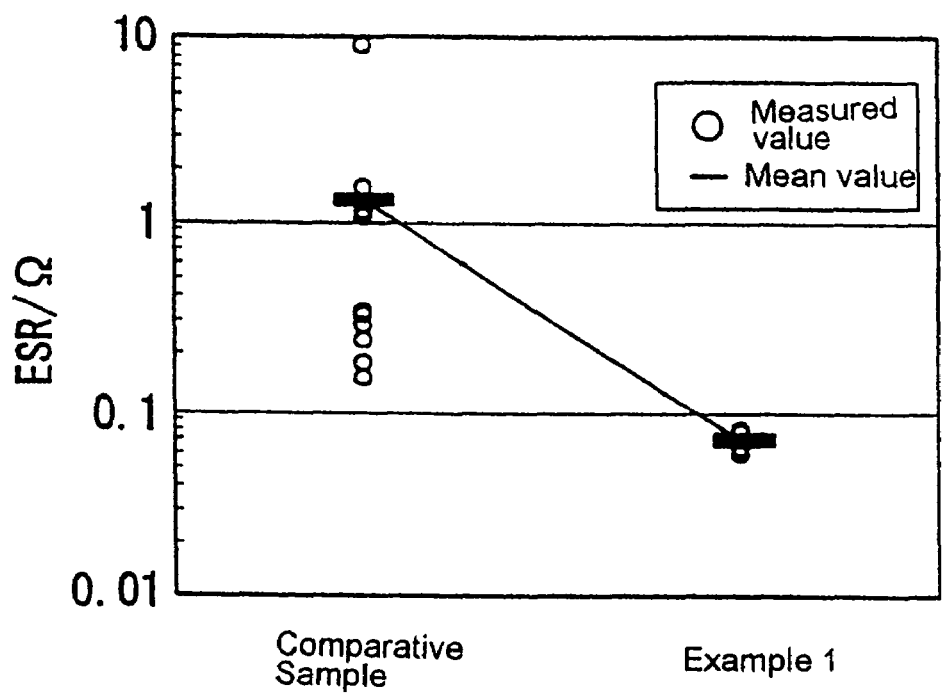
FIG. 12 is a graph illustrating ESR at 100 kHz of a wiring board on which an electrolytic capacitor obtained in Example 1 is mounted.

The ESR of each sample was determined by means of an impedance meter (available from Agilent). The ESRs at 100 kHz are shown in FIG. 12. As shown in FIG. 12, ESR of each sample containing the electrolytic capacitor with through holes of the present invention was significantly smaller than that of each sample for comparison. Further, the variations in ESR from sample to sample were small as to the samples of the present invention. This result demonstrates that the electrolytic capacitor of the present invention is suitable to be mounted on a wiring board using an electrically conductive adhesive.

Next, a circuit board with a built-in capacitor was fabricated by the following procedures, and an ESR of the circuit board was determined. Firstly, a solid component consisted of 81 wt % fused silica and 19 wt % epoxy resin (including a curing agent) were kneaded with MEK as a solvent using a planetary mixer. The mixing weight ratio of solid component to solvent was 10 to 1. This mixture was applied to a PET carrier film by a method using a doctor blade, so that a film was formed. Next, MEK was vaporized, so that a thermosetting sheet member with a thickness of 400 µm was formed.

Next, through holes with a diameter of 2 mm were formed in a predetermined positions of the sheet member by means of a punching machine. A via paste was made by kneading 87 wt % copper powder and 13 wt % epoxy resin (including a curing agent) by means of three rolls. This via paste was filled into the through holes formed in the sheet member by a printing method, so as to give an electrically insulating substrate.

On the sample which had been previously fabricated by mounting the electrolytic capacitor on the glass-epoxy board, the electrically insulating substrate and a copper foil with a thickness of 18 µm wherein one surface was roughened were superposed, and heated and pressurized at 180° C. under 1 MPa. The copper foil was superposed so that the roughened surface was brought into contact with the electrically insulating substrate. After completing the heating and pressurization, the copper foil was etched with an iron chloride solution, so that a circuit board as shown in FIG. 8(d) was obtained. Ten circuit boards were fabricated in this manner. For comparison, ten circuit boards were fabricated in the same manner using the samples which had been fabricated for comparison.

Figure 13:
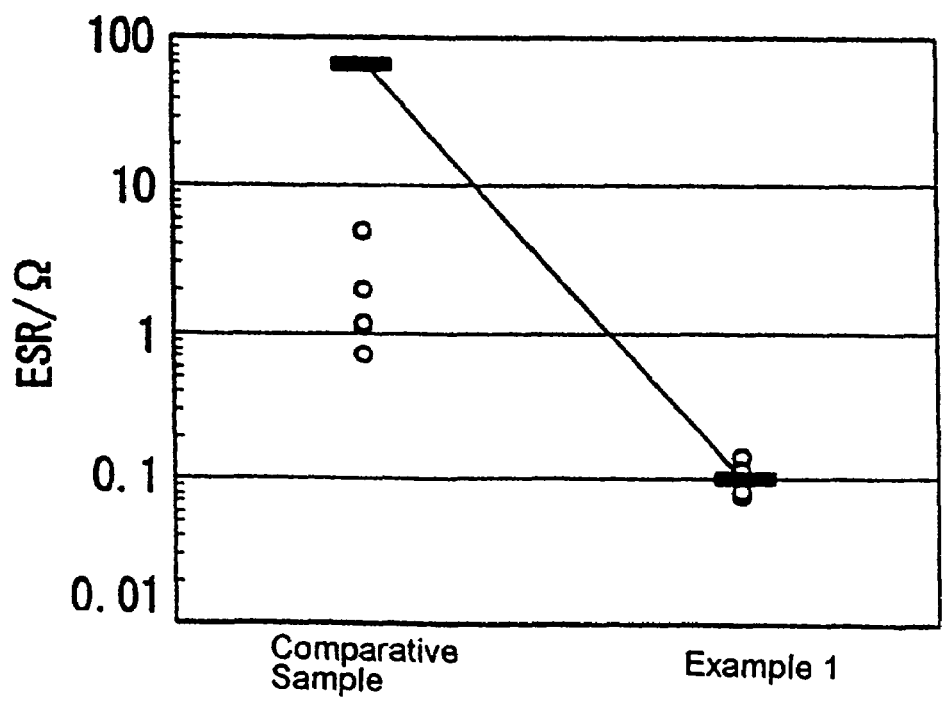

An ESR of each sample was determined using the above-described impedance meter. The ESRs at 100 kHz are shown in FIG. 13. As shown in FIG. 13, ESR of each circuit board into which the electrolytic capacitor of the present invention was incorporated was small, and the variations of ESRs were small as to these samples. On the other hand, ESR of each circuit board into which the electrolytic capacitor for comparison was incorporated was increased due to the incorporation of the capacitor, and variations were large as to these comparative samples.

Example 2

An electrically conductive resin composition was made by kneading 82 wt % Ag powder with a mean particle diameter of 12 µm and 18 wt % epoxy resin (including a curing agent) by means of three rolls. This conductive resin composition was filled into the through holes of the electrolytic capacitor fabricated in Example 1, by a screen printing method. After filling, a heat treatment is conducted at 150° C. for 10 minutes so as to bond the conductive resin composition to the exposed surface of the through hole (that is, to fix the composition within the through hole), whereby an electrolytic capacitor as shown in FIG. 3 was obtained. In Example 2, ten electrolytic capacitors were fabricated.

Each of these electrolytic capacitor was mounted on a glass-epoxy board in the same manner as in Example 1. The mean ESR at 100 kHz of these ten samples was 60 mΩ. This value is significantly lower than each of ESRs of the comparative samples shown in FIG. 12. Further, this value is lower than the mean value of the samples of Example 1 shown in FIG. 12. These results demonstrate that the through hole filled with the conductive resin composition is more advantageous for low-resistance connection.

Further, ten circuit boards were fabricated in the same manner as in Example 1 using this electrolytic capacitor. The mean ESR at 100 kHz of these circuit boards was 75 mΩ. This value is significantly lower than each of ESRs of the comparative samples shown in FIG. 13.

Example 3

The electrolytic capacitor unit as shown in FIG. 1 was produced in the same manner as in Example 1. Copper powder which was classified so that the diameter of each particle was at least 150 µm, was disposed on the electrode lead part of the valve metal element for an anode of this capacitor unit, and the electrode lead part was sandwiched with flat plates. Next, a pressure of 3 MPa was applied to the electrode lead part through the plates so that the copper powder was disposed within the valve metal element for an anode, resulting in an electrolytic capacitor as shown in FIG. 4. In one electrolytic capacitor, 10 to 15 particles were disposed within the valve metal element for an anode. In this example, ten electrolytic capacitors were produced.

Each of these electrolytic capacitors was mounted on a glass-epoxy board in the same manner as in Example 1. The mean ESR at 100 kHz of these ten samples was 55 mΩ. This value is significantly lower than each of ESRs of the comparative samples shown in FIG. 12. Further, this value is lower than that the mean value of the samples of Example 1 shown in FIG. 12. These results demonstrate that the configuration wherein the conductive particle pierces the valve metal element for an anode is more advantageous for low-resistance connection.

Further, ten circuit boards were fabricated in the same manner as in Example 1 using this electrolytic capacitor. The mean ESR at 100 kHz of these circuit boards was 65 mΩ. This value is significantly lower than each of ESRs of the comparative samples shown in FIG. 13.

Example 4

The electrolytic capacitor unit as shown in FIG. 1 was produced in the same manner as in Example 1. Six aluminum wires were made to pierce the electrode lead part of the valve metal element for an anode at six positions. Each wire has a diameter of 0.1 mm. Next, the aluminum wires were cut with a wire cutter so that both end portions of each wire extended beyond both surfaces of the electrode lead part, whereby an electrolytic capacitor as shown in FIG. 5 was obtained. The length of each end portion was approximately 50 µm. In this example, ten capacitors were produced.

Each of these electrolytic capacitor was mounted on a glass-epoxy board in the same manner as in Example 1. The mean ESR at 100 kHz of ten samples was 70 mΩ. This value is significantly lower than each of ESRs of the comparative samples shown in FIG. 12.

Further, ten circuit boards were fabricated in the same manner as in Example 1 using this electrolytic capacitor. The mean ESR at 100 kHz of these circuit boards was 80 mΩ. This value is significantly lower than that each of ESRs of the comparative samples shown in FIG. 13.

Example 5

The electrically conductive resin composition which was the same as that used in Example 2 was prepared, and applied to a surface of a flat plate. The electrode lead part of the electrolytic capacitor produced in Example 2 was sandwiched by two of such flat plates, and a pressure of 30 MPa was applied to the electrode lead part so that the conductive resin composition was transferred to the electrode lead part. Next, a heat treatment was conducted at 150° C. for 30 minutes, to give an electrolytic capacitor as shown in FIG. 7. In this example, ten capacitors were produced.

Each of these electrolytic capacitor was mounted on a glass-epoxy board in the same manner as in Example 1. The mean ESR at 100 kHz of ten samples was 65 mΩ. This value is significantly lower than each of ESRs of the comparative samples shown in FIG. 12.

Further, ten circuit boards were fabricated in the same manner as in Example 1 using this electrolytic capacitor. The mean ESR at 100 kHz of these circuit boards was 65 mΩ. This value is significantly lower than each of ESRs of the comparative samples shown in FIG. 13.

In the electrolytic capacitor of the present invention, the through hole formed in the electrode lead part of the valve metal element for an anode gives an electrical connection part of a low connection resistance. Therefore, this electrolytic capacitor is useful to produce a circuit board with a built-in capacitor, which board has a small size, high density and a low height and a low ESR and can realize high-frequency response and large-current drive.

What is claimed is:

1. A method for producing an electrolytic capacitor comprising:
    producing an electrolytic capacitor unit by a method including:
    forming a dielectric oxide film by oxidizing a surface of a valve metal element for an anode which includes a capacitor forming part and an electrode lead part; and
    forming a solid electrolyte layer on the dielectric oxide film, followed by forming a charge collecting element for a cathode on the solid electrolyte layer; and
    forming a through hole(s) in the electrode lead part of the valve metal element for an anode of the obtained electrolytic capacitor unit.

2. A method for producing an electrolytic capacitor comprising:
    forming a dielectric oxide film by oxidizing a surface of a valve metal element for an anode which includes a capacitor forming part and an electrode lead part;
    forming a through hole(s) in the electrode lead part of the valve metal element for an anode; and
    forming a solid electrolyte layer on the dielectric oxide film, followed by forming a charge collecting element for a cathode on the solid electrolyte layer, in the stated order.

3. The method according to claim 1, which further comprises:
    preparing an electrically conductive resin composition containing metal powder and an uncured thermosetting resin;
    filling with the electrically conductive resin the through hole(s) formed in the electrode lead part of the valve metal element for an anode; and
    connecting the electrically conductive resin composition to the core of the valve metal element by a heat treatment.

4. The method according to claim 3, which further comprises pressurizing the electrode lead part of the valve metal element for an anode after filling the through hole(s) with the electrically conductive resin composition.

5. The method according to claim 1, wherein through hole(s) is formed by disposing at least one electrically conductive particle within the electrode lead part of the valve metal element for an anode of the electrolytic capacitor unit, by placing the particle on the electrode lead part and then pressurizing so as to pierce the electrode lead part with the particle, the particle diameter being larger than the thickness of the valve metal element for an anode.

6. The method according to claim 1, wherein through hole(s) is formed by disposing at least one electrically conductive fiber within the electrode lead part of the valve metal element for an anode of the electrolytic capacitor unit, the fiber being longer than thickness of the valve metal element for an anode.

7. The method according to claim 1, wherein:
    the through hole is formed by:
        forming a stack by stacking a plurality of the electrolytic capacitor units in a thickness direction; and
        piercing the electrode lead parts of the valve metal elements for an anode of electrolytic capacitor units with at least one electrically conductive fiber, the fiber being longer than the thickness of the stack of the electrolytic capacitor units; and
    the stack is separated into a piece of electrolytic capacitor by cutting the electrically conductive fiber.

8. The method according to claim 1, which further comprises bringing at least one electrically conductive particle into contact with the core of the valve metal for an anode, by disposing the particle on the electrode lead part of the valve element for an anode followed by pressurization.

9. The method according to claim 1, which further comprises:
    bringing at least one electrically conductive particles into contact with the core of the valve metal element for an anode, by disposing an electrically conductive resin composition containing the particle and an uncured thermosetting resin on the electrode lead part of the valve metal element followed by pressurization; and
    bonding the electrically conductive resin composition to the electrode lead part of the valve metal element for an anode by a heat treatment.

10. The method according to claim 1, which further comprises:
    applying an electrically conductive resin composition containing metal powder and a thermosetting resin to the electrode lead part of the valve metal element for an anode; and
    bonding the electrically conductive resin composition to the electrode lead part of the valve metal element for an anode by a heat treatment.

11. A method producing a circuit board with a built-in capacitor comprising:
    preparing a first circuit board in which a wiring layer is formed in a predetermined wiring pattern on a surface of an electrically insulating layer;
    preparing an electrically conductive adhesive containing an electrically conductive filler and an uncured thermosetting resin;
    preparing a sheet member formed of an thermosetting resin composition containing an uncured thermosetting resin and an inorganic filler, as an electrically insulating substrate;
    applying the electrically conductive adhesive to a predetermined position of a surface of the wiring layer of the first circuit board;
    fixing an electrolytic capacitor to the first circuit board by disposing the capacitor on the applied adhesive and then by curing the adhesive through a heat treatment; and
    superposing the electrically insulating substrate on the first circuit board to which the electrolytic capacitor is fixed, followed by heating and pressurization, so as to form an electrically insulating layer within which the electrolytic capacitor is disposed,
    in which the electrolytic capacitor is an electrolytic capacitor comprising:
        a valve metal element for an anode including a capacitor forming part and an electrode lead part;
        a dielectric oxide film provided on a surface of the valve metal element for an anode;
        a solid electrolyte layer provided on the dielectric oxide film; and
        a charge collecting element for a cathode provided on the solid electrolyte layer,
        wherein at least one through hole is formed in the electrode lead part of the valve metal element for an anode to expose core of the valve metal element outside.

12. The method according to claim 11, wherein the electrically insulating layer constituting the first circuit board and the electrically insulating substrate are formed of the same thermosetting resin composition.

13. A method producing a circuit board with a built-in capacitor comprising:
    preparing an electrically conductive adhesive containing an electrically conductive filler and an uncured thermosetting resin;
    preparing a sheet member formed of a thermosetting resin composition containing an uncured thermosetting resin and an inorganic filler, as an electrically insulating substrate;
    applying the electrically conductive adhesive to a predetermined position of a surface of a metal foil;
    fixing an electrolytic capacitor to the metal foil by disposing the capacitor on the applied adhesive and then by curing the adhesive through a heat treatment;
    superposing the electrically insulating substrate on the metal foil to which the electrolytic capacitor is fixed, followed by heating and pressurization, so as to form an electrically insulating layer within which the capacitor is disposed, and patterning the metal foil so as to form a wiring layer in a predetermined wiring pattern, in which the electrolytic capacitor is an electrolytic capacitor comprising:

a valve metal element for an anode including a capacitor forming part and an electrode lead part;

a dielectric oxide film provided on a surface of the valve metal element for an anode;

a solid electrolyte layer provided on the dielectric oxide film; and a charge collecting element for a cathode provided on the solid electrolyte layer, wherein at least one through hole is formed in the electrode lead part of the valve metal element for an anode to expose core of the valve metal element outside.

14. The method according to claim 12, wherein the metal foil is a copper foil.

15. A method producing a circuit board with a built-in capacitor comprising:

forming a wiring layer in a predetermined wiring pattern on one surface of a releasable carrier;

preparing an electrically conductive adhesive containing an electrically conductive filler and an uncured thermosetting resin;

preparing a sheet member formed of a thermosetting resin composition containing an uncured thermosetting resin and an inorganic filler, as an electrically insulating substrate;

applying the electrically conductive adhesive to a predetermined position of a surface of the wiring layer;

fixing an electrolytic capacitor to the releasable carrier by disposing the capacitor on the applied adhesive and then by curing the adhesive through a heat treatment;

superposing the electrically insulating substrate on the releasable carrier to which the electrolytic capacitor is fixed, followed by heating and pressurization, so as to form an electrically insulating layer within which the electrolytic capacitor is disposed; and exposing the wiring layer by removing the releasable carrier, in which the electrolytic capacitor is an electrolytic capacitor comprising:

valve metal element for an anode including a capacitor forming part and an electrode lead part;

a dielectric oxide film provided on a surface of the valve metal element for an anode;

a solid electrolyte layer provided on the dielectric oxide film; and a charge collecting element for a cathode provided on the solid electrolyte layer, wherein at least one through hole is formed in the electrode lead part of the valve metal element for an anode to expose core of the valve metal element outside.

16. The method according to claim 11, wherein as the electrically insulating substrate, an electrically insulating substrate wherein one or more through holes are formed in a predetermined position and the hole(s) is filled with a via paste containing electrically conductive powder and an uncured thermosetting resin is prepared, and an inner via(s) is formed upon forming the electrically insulating layer by the heating and pressurization.

17. The method according to claim 13, wherein as the electrically insulating substrate, an electrically insulating substrate wherein one or more through holes are formed in a predetermined position and the hole(s) is filled with a via paste containing electrically conductive powder and an uncured thermosetting resin is prepared, and an inner via(s) is formed upon forming the electrically insulating layer by the heating and pressurization.

18. The method according to claim 15, wherein as the electrically insulating substrate, an electrically insulating substrate wherein one or more through holes are formed in a predetermined position and the hole(s) is filled with a via paste containing electrically conductive powder and an uncured thermosetting resin is prepared, and an inner via(s) is formed upon forming the electrically insulating layer by the heating and pressurization.

19. The method according to claim 16, wherein the electrolytic capacitor is disposed within the electrically insulating layer so that the inner via in the electrically insulating layer contacts with the electrode lead part of the valve metal element for an anode of the electrolytic capacitor.

20. The method according to claim 17, wherein the electrolytic capacitor is disposed within the electrically insulating layer so that the inner via in the electrically insulating layer contacts with the electrode lead part of the valve metal element for an anode of the electrolytic capacitor.

21. The method according to claim 18, wherein the electrolytic capacitor is disposed within the electrically insulating layer so that the inner via in the electrically insulating layer contacts with the electrode lead part of the valve metal element for an anode of the electrolytic capacitor.

* * * * *